(12) United States Patent
Gomyo et al.

(10) Patent No.: US 8,402,644 B2
(45) Date of Patent: Mar. 26, 2013

(54) METHOD OF MANUFACTURING AN ELECTRONIC PARTS PACKAGING STRUCTURE

(75) Inventors: Toshio Gomyo, Nagano (JP); Yukiharu Takeuchi, Nagano (JP); Hidenori Takayanagi, Nagano (JP); Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 28 days.

(21) Appl. No.: 12/926,072

(22) Filed: Oct. 25, 2010

(65) Prior Publication Data

US 2011/0039370 A1 Feb. 17, 2011

Related U.S. Application Data

(62) Division of application No. 11/486,051, filed on Jul. 14, 2006, now Pat. No. 7,843,059.

(30) Foreign Application Priority Data

Jul. 21, 2005 (JP) .................................. 2005-211938
Dec. 27, 2005 (JP) .................................. 2005-373859

(51) Int. Cl.
    *H05K 3/36* (2006.01)
(52) U.S. Cl. ................. 29/830; 29/825; 29/829; 29/846
(58) Field of Classification Search ............ 29/830, 29/825, 829, 832, 846; 257/673, 685, 686, 257/692, 723, E21.503
See application file for complete search history.

(56) References Cited

U.S. PATENT DOCUMENTS

| 5,771,381 | A  | * | 6/1998 | Jones et al. ................... 713/100 |
| 5,939,779 | A  |   | 8/1999 | Kim |
| 6,469,374 | B1 |   | 10/2002 | Imoto |
| 7,053,475 | B2 |   | 5/2006 | Akagawa |
| 2001/0004130 | A1 |   | 6/2001 | Higashi et al. |
| 2005/0161833 | A1 |   | 7/2005 | Takeuchi et al. |
| 2005/0184377 | A1 |   | 8/2005 | Takeuchi et al. |

FOREIGN PATENT DOCUMENTS

| JP | 2000-323645 A | 11/2000 |
| JP | 2001-177045 A | 6/2001 |
| JP | 2001-196525 A | 7/2001 |
| JP | 2002-026250 A | 1/2002 |
| JP | 2005-209689 A | 8/2005 |
| JP | 2005-217225 A | 8/2005 |

OTHER PUBLICATIONS

Office Action in corresponding Japanese Patent Application No. 2005-373859 mailed on Apr. 27, 2010.

* cited by examiner

*Primary Examiner* — Thiem Phan
(74) *Attorney, Agent, or Firm* — Edwards Wildman Palmer LLP; James E. Armstrong, IV; George N. Chaclas

(57) ABSTRACT

A method of manufacturing an electronic parts packaging structure including the steps of preparing a plurality of sheet-like units each of which is constructed by a first insulating layer, a wiring formed on one surface of the first insulating layer, electronic parts connected to the wiring, a second insulating layer formed on an one surface side of the first insulating layer to cover the electronic parts, and a connecting portion for connecting electrically the wiring, and stacking mutually the units to arrange directions of unit adjacent in a thickness direction alternately oppositely, and bonding the units such that electronic parts of respective units are electrically connected mutually via connecting portions.

5 Claims, 18 Drawing Sheets

METHOD OF MANUFACTURING AN ELECTRONIC PARTS PACKAGING STRUCTURE

CROSS-REFERENCE TO RELATED APPLICATIONS

This application is a divisional application of U.S. application Ser. No. 11/486,051, filed on Jul. 14, 2006, now U.S. Pat. No. 7,843,059 issued on Nov. 30, 2010, and claims the right of priority under 35 U.S.C. §119 based on Japanese Patent Application Nos. 2005-211938 filed Jul. 21, 2005 and 2005-373859 filed Dec. 27, 2005, which are hereby incorporated by reference herein in their entirety as if fully set forth herein.

BACKGROUND OF THE INVENTION

1. Field of the Invention

The present invention relates to an electronic parts packaging structure and a method of manufacturing the same and, more particularly, an electronic parts packaging structure having a package structure in which electronic parts such as a semiconductor device (chip), and the like are mounted in an inside of a wiring substrate to attain a reduction in thickness and a method of manufacturing the same.

2. Description of the Related Art

Improvements in the functions of the electronic parts are facilitated recently. The LSI (Large Scale Integrated Circuit) technology as the key technology makes progress steadily toward a higher speed and a larger capacity of the data transmission. Also, the LSI packaging technology is progressing year by year, and a large number of LSIs can be mounted in a narrow space at a high density.

In reply to the request for the higher density, the multi-chip package (semiconductor device) in which a plurality of semiconductor chips are stacked and mounted three-dimensionally on the wiring substrate has been developed. As an example, there is the semiconductor device having such a structure that a plurality of semiconductor chips are mounted three-dimensionally on the wiring substrate in a state that they are buried in the insulating film and a plurality of semiconductor chips are connected mutually via holes and wiring patterns formed in the insulating film (Patent Literatures 1 to 5, for example).

[Patent Literature 1] Patent Application Publication (KOKAI) 2001-196525
[Patent Literature 2] Patent Application Publication (KOKAI) 2001-177045
[Patent Literature 3] Patent Application Publication (KOKAI) 2000-323645
[Patent Literature 4] Patent Application Publication (KOKAI) 2005-217225
[Patent Literature 5] Patent Application Publication (KOKAI) 2005-209689

Meanwhile, in case the insulating film for coating the semiconductor chip is formed of a resin, the semiconductor chips and the wiring (metal films), whose coefficients of thermal expansion are different from that of the resin film, exist in the resin film. Therefore, the semiconductor device is warped easily due to a thermal stress caused by a difference between these coefficients of thermal expansion when the resin film is thermally treated and formed. As a result, it is possible that such defects are produced that such warp interferes with handling of the semiconductor device in post treatment, the reliability of connection is decreased upon mounting the semiconductor device on the mounting substrate (mother board), etc.

In above Patent Literatures 1 to 5, the structure in which the semiconductor chips are buried and mounted in the insulating film (resin film) are set forth respectively, nevertheless no consideration is given to the warp of the semiconductor device caused due to the above thermal stress.

SUMMARY OF THE INVENTION

It is an object of the present invention to provide an electronic parts packaging structure capable of increasing a mounting density much higher than the prior art and preventing generation of a warp in such a structure that electronic parts are mounted while they are buried in an insulating film, and a method of manufacturing the same.

An electronic parts packaging structure of the present invention constructed by stacking a plurality of sheet-like units in a thickness direction, each of the units includes a first insulating layer, a wiring formed on one surface of the first insulating layer, an electronic parts connected to the wiring, a second insulating layer formed on an one surface side of the first insulating layer to cover the electronic parts, and a connecting portion for connecting electrically the wiring and a wiring of other unit, wherein arrangement of the first insulating layer, the electronic parts, the wiring, and the second insulating layer is symmetrical between units adjacent in a thickness direction.

The electronic parts packaging structure of the present invention is constructed by stacking the sheet-like units in which the electronic parts is buried respectively. Each unit is constructed by the first insulating layer, the wirings, the electronic parts such as the semiconductor chip, or the like, the second insulating layer, and connecting portions, and does not have a high strength supporting substrate (a thick substrate) serving as a core. Also, a total strength can be ensured by stacking a plurality of units. As a result, the electronic parts packaging structure of the present invention achieves a much higher mounting density of the electronic parts than the electronic parts packaging structure with the supporting substrate in the prior art.

Also, in the present invention, the arrangement of the first insulating layer, the electronic parts, the wirings, and the second insulating layer is symmetrical between units adjacent in a thickness direction. Therefore, even when a thermal stress is caused due to differences in the coefficients of thermal expansion among the electronic parts, the insulating layers, and the wirings (metal films), warping directions due to the thermal stress come opposite in the units adjacent in the thickness direction and thus warps are cancelled mutually. As a result, it can be prevented that the warp is caused in the electronic parts packaging structure.

In one preferred mode of the present invention, the first insulating layer is formed of a solder resist. In the present invention, the first insulating layer is arranged on the outermost surface of the electronic parts packaging structure. Normally the insulating layer in which the electronic parts is buried (the second insulating layer) is formed of the epoxy resin, or the like. In this case, commonly the solder resist is higher in strength than the epoxy resin. Therefore, when the first insulating layer arranged on the outermost surface is formed of the solder resist, a strength of the electronic parts packaging structure can be increased and generation of the defects such as damage, etc. can be suppressed.

In case the electronic parts is the semiconductor chip, it is preferable that the device forming surface of the semiconductor chip should be protected by the protection film. In this case, if a coefficient of thermal expansion of the protection film is adjusted to the midway of a coefficient of thermal expansion of the semiconductor chip and a coefficient of thermal expansion of the first insulating layer 22 by mixing silica, or the like with the protection film, a stress generated due to a difference in the coefficient of thermal expansion between the semiconductor chip and the first insulating layer can suppressed.

Also, a method of manufacturing an electronic parts packaging structure of the present invention, includes the steps of preparing a plurality of sheet-like units each of which is constructed by a first insulating layer, a wiring formed on one surface of the first insulating layer, an electronic parts connected to the wiring, a second insulating layer formed on an one surface side of the first insulating layer to cover the electronic parts, and a connecting portion for connecting electrically the wiring, and stacking mutually the units to arrange directions of unit adjacent in a thickness direction alternately oppositely, and bonding the units such that electronic parts of respective units are electrically connected mutually via connecting portions.

In the present invention, the units are bonded to arrange directions of the units adjacent in a thickness direction alternately oppositely. Therefore, the arrangement of the first insulating layer, the electronic parts, the wirings, and the second insulating layer is symmetrical between the units adjacent in the thickness direction. As a result, even when a thermal stress due to the difference in the coefficient of thermal expansion between the electronic parts and the insulating layer and the wirings (metal films) is generated, directions of the thermal stress come opposite in these units and thus the warp of the electronic parts packaging structure can be avoided.

The unit is manufactured, for example, via a first step of forming a first insulating film made of an insulating resin on a substrate, a second step of forming an opening by patterning the first insulating film, a third step of forming a recess by etching the substrate exposed from the opening, a fourth step of forming a terminal by filling a metal in the opening, a fifth step of forming a wiring, which is connected to the terminal, on the first insulating film, a sixth step of bonding an electronic parts onto the wiring, a seventh step of forming a second insulating layer, which covers the electronic parts, on the first insulating film, an eighth step of forming a hole that reaches the wiring from an upper surface of the second insulating layer, a ninth step of forming a contact via by filling a metal in the hole, and a tenth step of removing the substrate.

Since the unit manufactured in this manner has no high strength supporting substrate (a thick substrate) serving as a core, the electronic parts packaging structure of the present invention can achieve a much higher mounting density than the electronic parts packaging structure with the supporting substrate in the prior art. Also, in the method of the present invention, since the first insulating layer, the wirings, the electronic parts, the second insulating layer, and the like are supported by the substrate until the ninth step and then the substrate is removed by executing the tenth step after two units are bonded, for example, no hindrance to the handling in the manufacturing steps is caused.

In one preferred mode of the present invention, a third insulating layer is formed on a lower surface of the substrate in the first step, and the third insulating layer is removed during a time from an end of the ninth step to a start of the tenth step. It may be considered that, when the insulating layer (the first insulating layer) is formed only on the upper surface of the substrate, the warp due to the difference of the coefficient of the thermal expansion between the substrate and the insulating layer is caused in the heat treatment such as the post baking, or the like. As described above, if the insulating layer (the third insulating layer) is also formed on the lower surface of the substrate, the direction in which the warp is caused comes opposite on and under the substrate and resultantly the warp can be suppressed.

Also, another method of manufacturing an electronic parts packaging structure of the present invention, includes a step of forming a plurality of sheet-like units each of which is constructed by a first insulating layer, a wiring formed on one surface of the first insulating layer, an electronic parts connected to the wiring, and a second insulating layer formed on an one surface side of the first insulating layer to cover the electronic parts; a step of forming a stacked structural body by stacking the plurality of units to arrange directions of unit adjacent in a thickness direction alternately oppositely; a step of forming a through hole, which passes through the first insulating layer, the wiring, and the second insulating layer of respective units, in the stacked structural body; and a step of forming a connecting portion, which connects electrically wirings of respective units, by filling a conductor in the through hole.

In the present invention, the units are also bonded to arrange directions of the units adjacent in a thickness direction alternately oppositely. Therefore, the arrangement of the first insulating layer, the electronic parts, the wirings, and the second insulating layer is symmetrical between the units adjacent in the thickness direction. As a result, even when a thermal stress due to the difference in the coefficient of thermal expansion between the electronic parts and the insulating layer and the wirings (metal films) is generated, directions of the thermal stress come opposite in these units and thus the warp of the electronic parts packaging structure can be avoided.

In one preferred mode of the present invention, the step of forming the units includes a step of forming a first insulating layer made of an insulating resin on a substrate, a step of forming a wiring on the first insulating layer, a step of bonding an electronic parts onto the wiring, and a step of forming a second insulating layer, which covers the electronic parts, on the first insulating layer. Also, the stacked structural body is formed by executing sequentially a pair unit forming step of forming a pair unit by bonding two unit each having the substrate to oppose a surface on which the electronic parts is mounted to each other, a substrate removing step of removing the substrate from the pair unit, and a stacking step of stacking a plurality of pair units.

In the present invention, the through holes are formed in the stacked structural body to pass through the first insulating layer, the wiring, and the second insulating layer, and then the wirings of respective units are connected electrically by filling the conductor in the through holes. In this case, for example, the substrate is left in only the lowest unit, and then the connecting portions can be formed by forming the through holes, which reaches the substrate from an upper surface of the stacked structural body, by means of a drill or a laser irradiation, and by depositing a conductor such as copper, or the like in the through holes by means of a plating method. The substrate of the lowermost unit is removed after the connecting portions are formed.

DETAILED DESCRIPTION OF THE PREFERRED EMBODIMENTS

Embodiments of the present invention will be explained with reference to the accompanying drawings hereinafter.

First Embodiment

Figure 1:
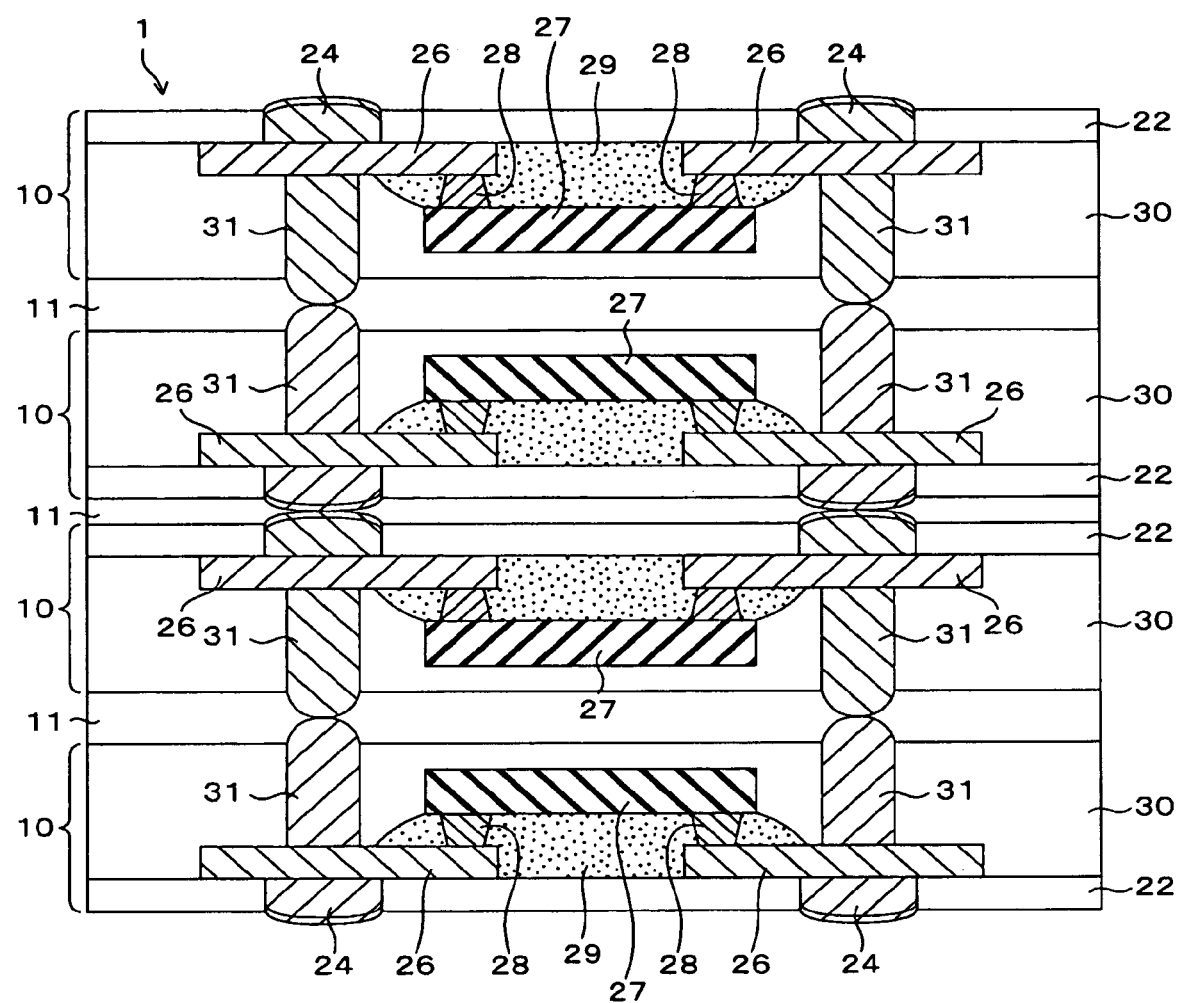
FIG. 1 is a sectional view showing an electronic parts packaging structure according to a first embodiment of the present invention.

FIG. 1 is a sectional view showing an electronic parts packaging structure according to a first embodiment of the present invention.

An electronic parts packaging structure (semiconductor device) 1 of the present embodiment has a structure that plural (four in FIG. 1) sheet (thin film)-like units 10 are stacked to put an insulating layer 11 between them. Each unit 10 is constructed by a insulating resin layer (second insulating layer) 30, a semiconductor chip (electronic parts) 27 buried in the insulating resin layer 30, a solder resist layer (first insulating layer) 22, wirings 26, terminals 24, and contact vias 31. A thickness of one unit 10 is almost 200 μm (almost 100 to 300 μm), for example, and neighboring units 10 in the vertical direction (thickness direction) are electrically connected mutually via the terminals 24 or the contact vias 31 (connecting portions).

The electronic parts packaging structure 1 of the present embodiment has one feature that, as shown in FIG. 1, the neighboring units 10 in the vertical direction are arranged mutually in the opposite direction. That is, arrangement of the solder resist layer 22, the semiconductor chip 27, the wirings 26, the terminals 24, the contact vias 31, etc. is vertically symmetrical between two units 10 adjacent in the vertical direction.

One unit 10 is constructed by the insulating resin layer 30, the semiconductor chip 27, the solder resist layer 22, the wirings 26, the terminals 24, and the contact vias 31, as described above. The solder resist layer 22 is stuck to one surface of the insulating resin layer 30. The wirings 26 are formed on a surface of the solder resist layer 22 of the insulating resin layer 30 side, and are connected electrically via connection terminals of the semiconductor chip 27 and bumps 28. An underfill (protection film) 29 is filled in a space between the semiconductor chip 27 and the solder resist layer 22 to protect a device forming area of the semiconductor chip 27.

The terminals 24 are formed to pass through the solder resist layer 22, and are jointed to one surfaces of the wirings 26. Also, the contact vias 31 are buried in the insulating resin layer 30 and formed, and are connected to other surfaces of the wirings 26.

As described above, in the electronic parts packaging structure 1 of the present embodiment, each unit 10 is constructed by the solder resist layer 22, the semiconductor chip 27, the insulating resin layer 30, and the like, and no high strength supporting substrate (in other words, a thick substrate) serving as a core is provided. Also, a general strength of the packaging structure can be ensured by stacking a plurality of units 10. As a result, the electronic parts packaging structure 1 of the present embodiment achieves such an effect that a mounting density can be increased much higher than the electronic parts packaging structure with the supporting substrate in the prior art.

Also, in the electronic parts packaging structure 1 of the present embodiment, the solder resist layer 22, the semiconductor chip 27, the wirings 26, the terminals 24, the contact vias 31, and the like are arranged to be symmetrical to each other in the units 10 adjacent vertically. Therefore, even when a thermal stress is caused due to differences in the coefficients of thermal expansion among the semiconductor chip 27, the insulating resin layer 30, and the wirings (metal films) 26, warping directions due to the thermal stress come opposite in the units 10 adjacent vertically. As a result, it can be prevented that the warp is caused in the electronic parts packaging structure 1 because their thermal stress can be cancelled.

Also, in the electronic parts packaging structure 1 of the present embodiment, an outermost surface is covered with the solder resist layer 22 made of an acrylic-based resin or an epoxy-based resin. Normally the solder resist layer 22 is higher in strength than the insulating resin layer 30 made of an epoxy resin, or the like. For this reason, the present embodiment possesses such an advantage that a strength of the electronic parts packaging structure can be increased rather than the case where the insulating resin layer made of epoxy resin, or the like is exposed from the outermost surface and that the electronic parts packaging structure is hard to break.

Figure 2A:
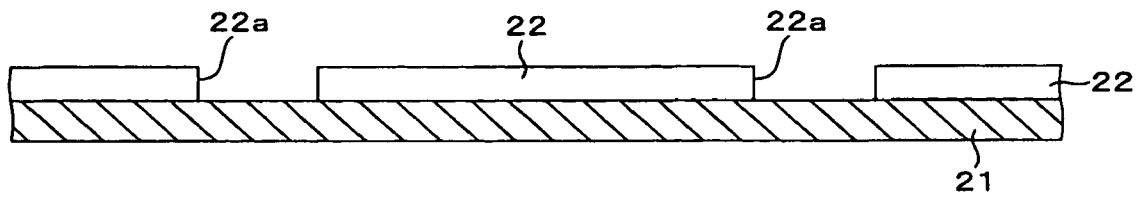
FIGS. 2A to 2O are sectional views showing a method of manufacturing an electronic parts packaging structure according to the first embodiment of the present invention.
Figure 2B:
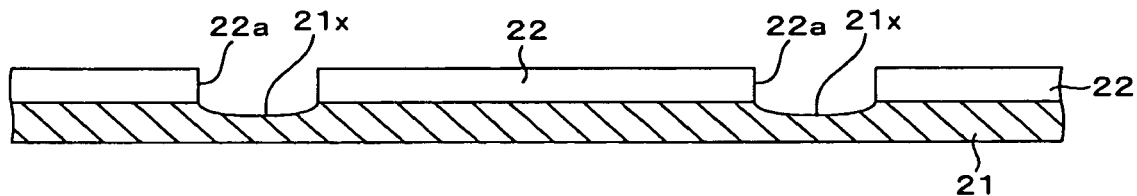
Figure 2C:
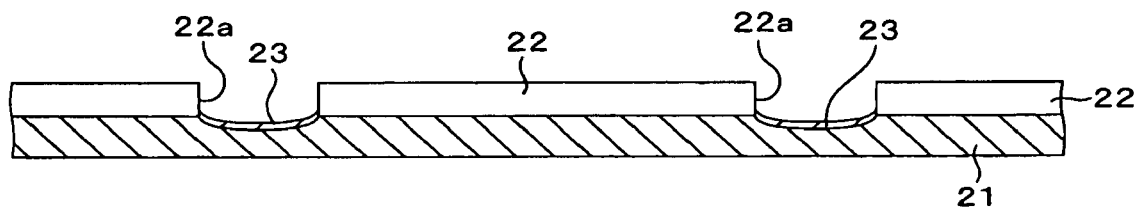
Figure 2D:
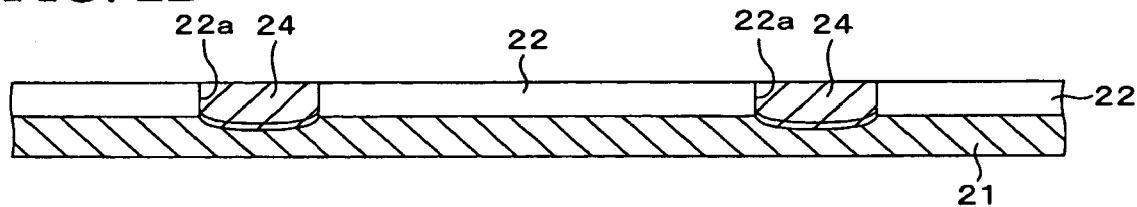
Figure 2E:
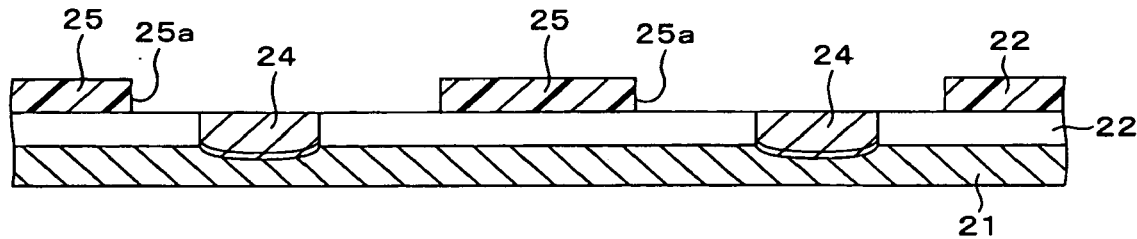
Figure 2F:
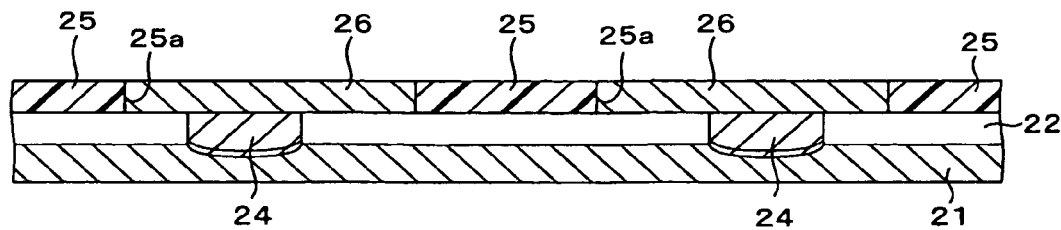
Figure 2G:
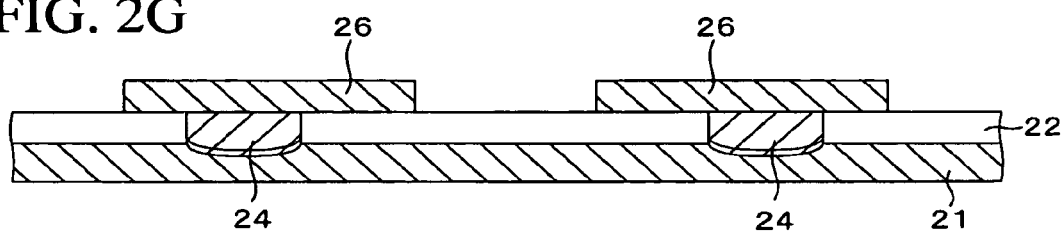
Figure 2H:
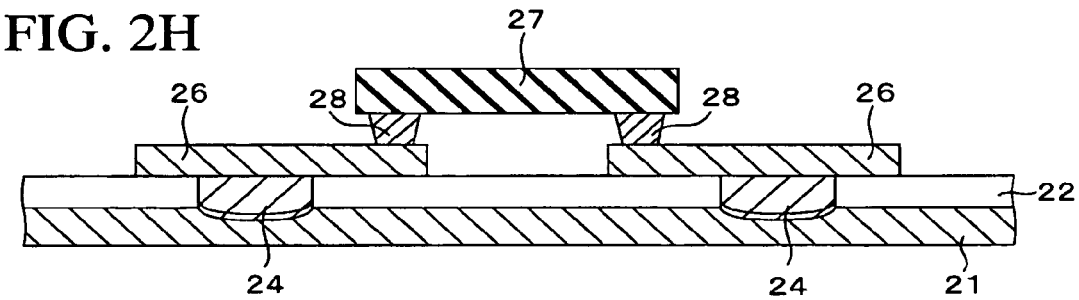
Figure 2I:
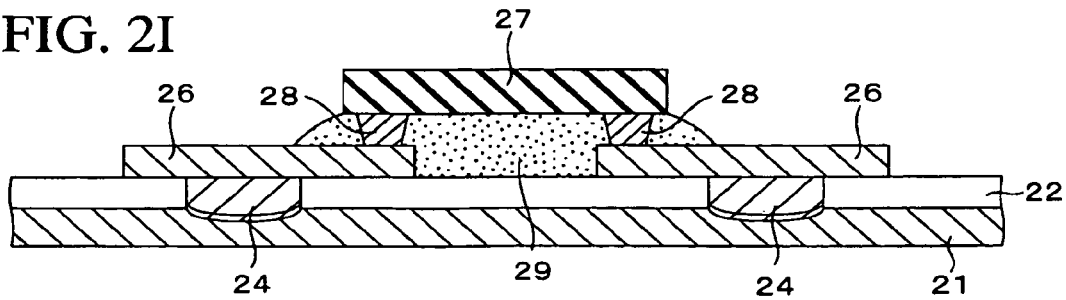
Figure 2J:
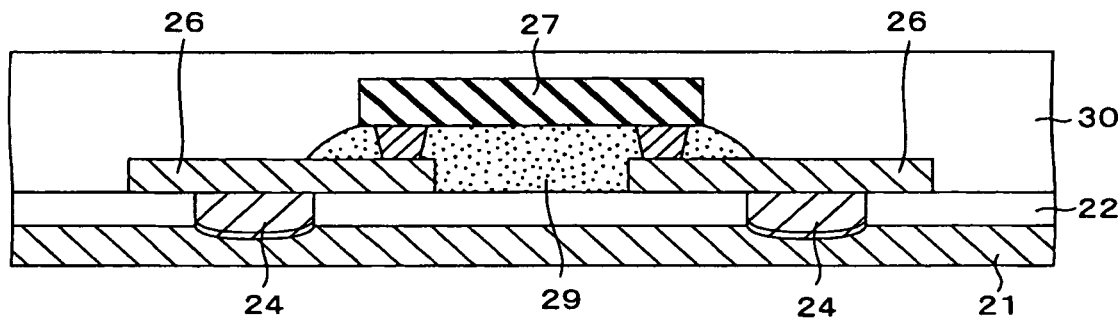
Figure 2K:
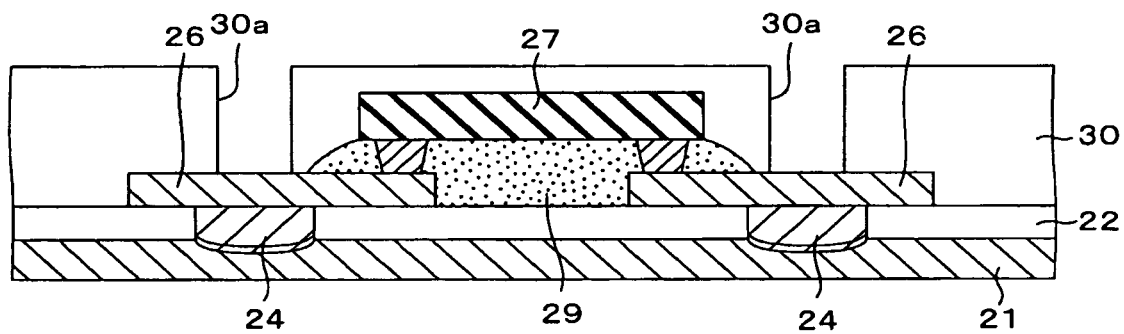
Figure 2L:
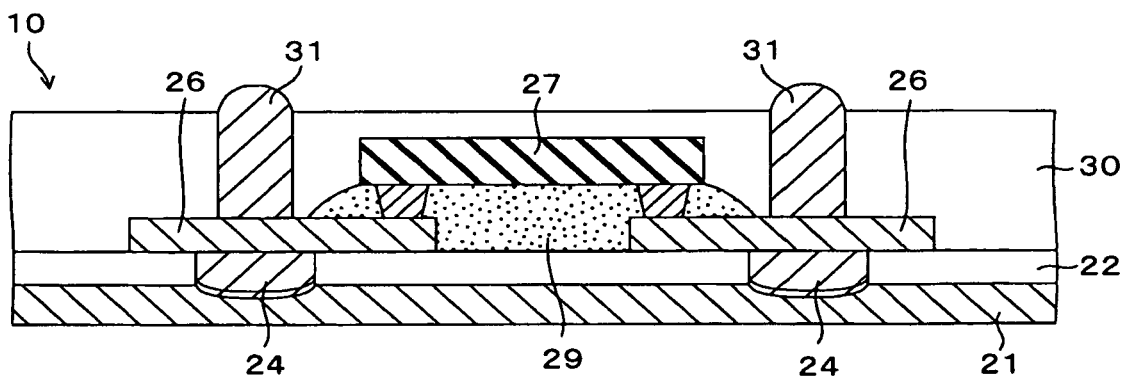
Figure 2M:
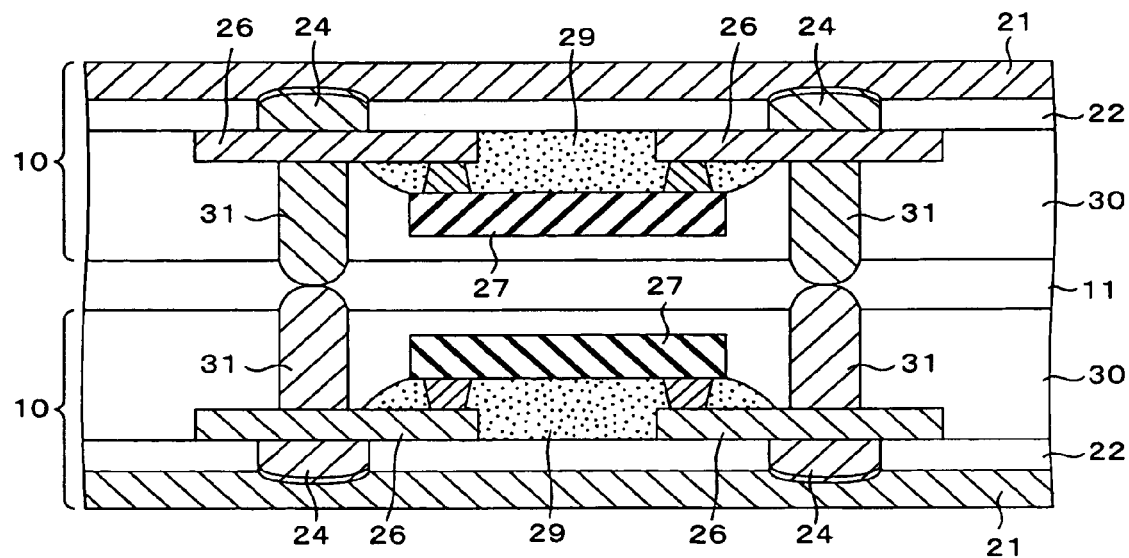
Figure 2N:
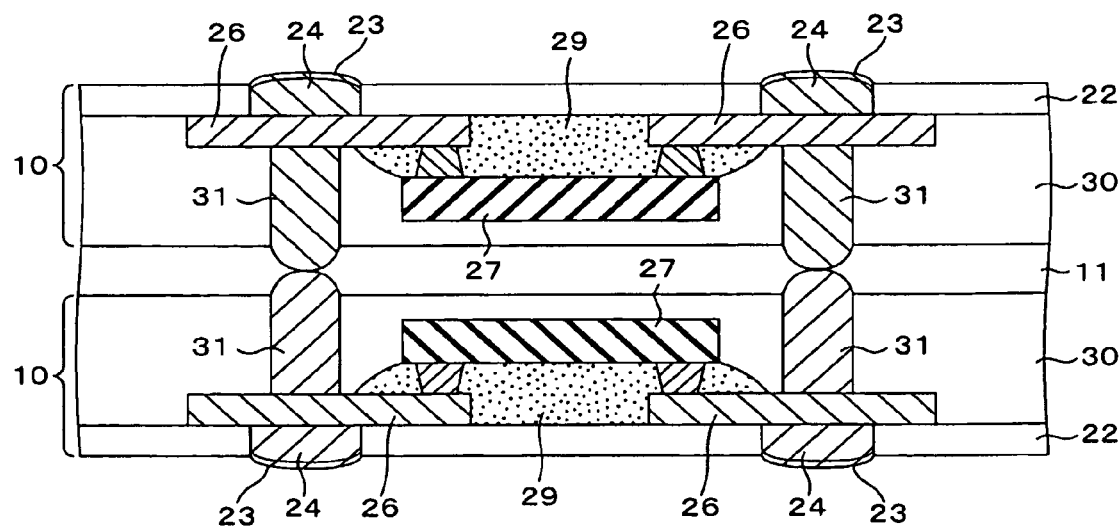
Figure 2O:
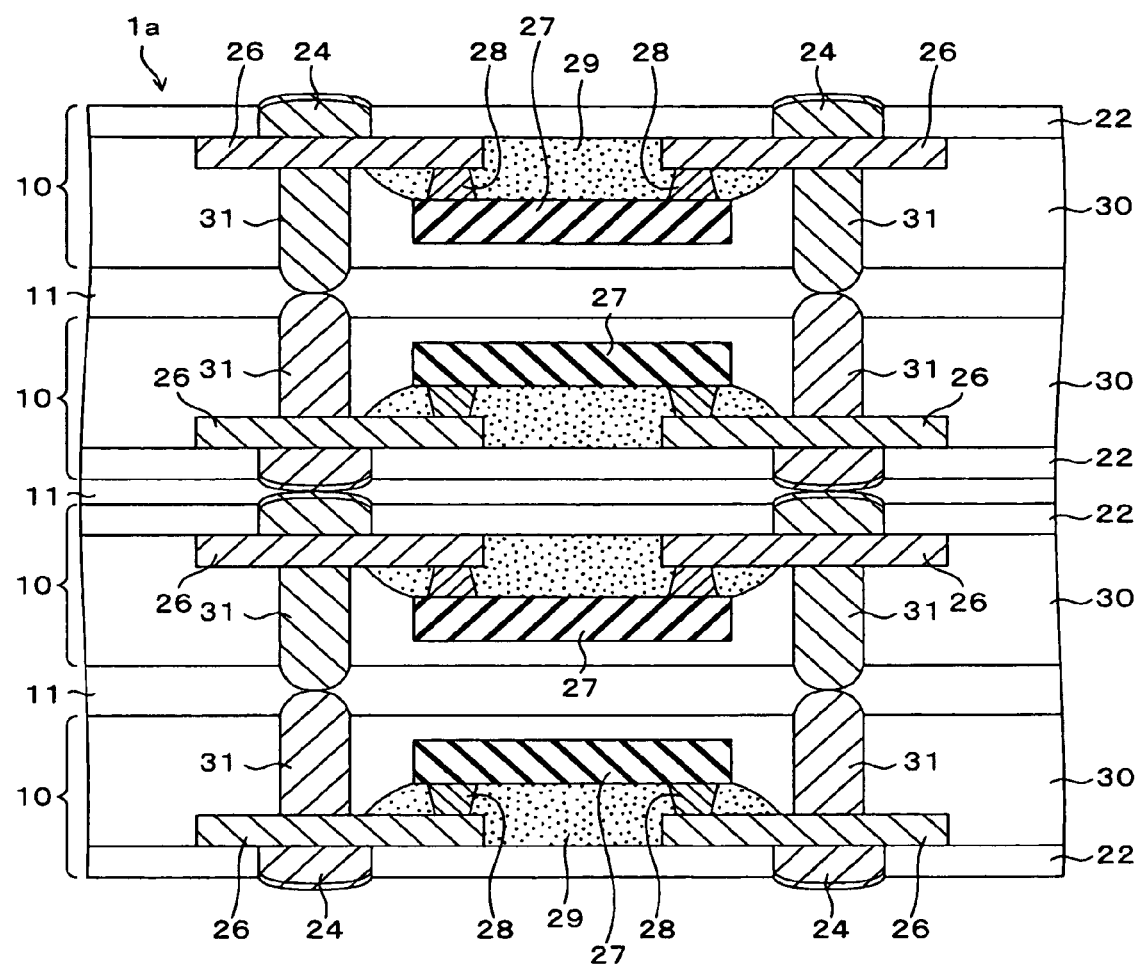

FIGS. 2A to 2O are sectional views showing a method of manufacturing an electronic parts packaging structure according to the first embodiment of the present invention in order of steps. In this case, in FIGS. 2A to 2O, only one unit forming area is shown to simplify the explanation, but actually a plurality of units 10 are formed simultaneously on a sheet of substrate 21.

First, in first step (see FIG. 2A), the substrate 21 made of copper (Cu) and having a size of 300 mm×500 mm and a thickness of 0.1 mm, for example, is prepared. Then, a photosensitive solder resist is coated on one surface of the substrate 21 by the screen printing method, and thus the solder resist layer 22 of 20 to 30 μm thickness, for example, is formed. Then, the solder resist layer 22 is exposed via a predetermined exposure mask (not shown). Then, opening portions 22a from which a surface of the substrate 21 is exposed are formed by applying the developing process to the solder resist layer 22. Then, the post baking is applied at a temperature of 150 to 200° C., for example.

Here, the substrate 21 has a role as a supporting member to support the solder resist layer 22, and the like and a role as a current feeding layer at a time of the electroplating. Therefore, strength and conductivity are demanded of the substrate 21 to some extent. Also, it is necessary that the substrate 21 can be removed easily by the step described later. As the substrate 21, 42 Alloy (Fe—Ni alloy) plate, for example, can be employed in addition to the copper plate mentioned above.

In this case, if the substrate 21 is too thick, a time required for the later step to remove the substrate 21 is prolonged. Therefore, it is preferable that the substrate 21 should be thinned not to interfere with the handling.

In next step (see FIG. 2B), the substrate 21 is etched by using the solder resist layer 22 as a mask, and thus recesses 21x of several tens μm (e.g., 30 μm) depth are formed. An amount of projection of the terminal 24 from the solder resist layer 22 is decided depending upon a depth of the recess 21x.

Then, in next step (see FIG. 2C), the solder is pasted by the electroplating while using the solder resist layer 22 as a mask, and thus a solder layer 23 of 2 to 7 μm thickness, for example, is formed on surfaces of the recesses 21x. This solder layer 23 acts as an etching stopper when the substrate 21 is removed by the etching in the later step. In this case, tin (Sn), for example, may be plated instead of the solder layer 23.

After the solder layers 23 are formed, the surface of the solder resist layer 22 is made rough by applying the plasma process (dry etching). This plasma process is not indispensable, but preferably the plasma process should be applied to ensure sufficiently adhesiveness of the dry film or the plating layer used in the later step.

In next step (see FIG. 2D), the terminals 24 are formed by filling a copper in the opening portions 22a in the solder resist layer 22 by means of the electroplating of copper. Then, a seed layer (not shown) is formed on the solder resist layer 22 and the terminals 24 by the electroless plating of copper.

In next step (see FIG. 2E), a dry film (photosensitive resist film) 25 is pasted over the substrate 21. The dry film 25 is exposed by using a predetermined exposure mask (not shown), and then opening portions 25a are formed in the dry film 25 by applying the developing process. These opening portions 25a are used to form the wirings 26 in next step.

In next step (see FIG. 2F), a copper is filled in the opening portions 25a in the dry film 25 by the electroplating of copper, and thus the wirings 26 are formed. Then, in next step (see FIG. 2G), the dry film 25 is removed by a removing liquid. Then, the wirings 26 are separated electrically by removing the exposed seed layer by means of the etching.

In next step (see FIG. 2H), the semiconductor chip 27 is flip-chip bonded to the wirings 26. A thickness of the semiconductor chip 27 is thinned to 150 μm or less (preferably almost 50 μm), for example. The connection electrodes are provided to edge portions of a device forming surface (lower side in FIG. 2H). Then, the bumps (e.g., Au stud bumps) 28 are formed on the connection electrodes (lower side in FIG. 2H), and the semiconductor chip 27 is connected electrically to the wirings 26 via the bumps 28.

In next step (see FIG. 2I), the underfill 29 is filled between the semiconductor chip 27 and the substrate 21 (the solder resist layer 22 and the wirings 26). As the underfill 29, an epoxy resin, for example, can be employed. It is preferable that a coefficient of thermal expansion of the underfill 29 should be adjusted to the midway of a coefficient of thermal expansion of the semiconductor chip 27 and a coefficient of thermal expansion of the solder resist layer 22 by mixing the filler such as silica, for example, with the underfill 29.

In next step (see FIG. 2J), the insulating resin layer 30 is formed by patting a film-like epoxy resin on the substrate 1 to cover the semiconductor chip 27. Then, the epoxy resin constituting the insulating resin layer 30 is cured. Instead of the pasting of the film-like epoxy resin, the insulating resin layer 30 may be formed by coating the epoxy resin. Also, a polyimide resin or other insulating resin may be employed in place of the epoxy resin.

In next step (see FIG. 2K), opening portions 30a from which the wiring 26 is exposed are formed by opening holes to process the insulating resin layer 30 by means of the carbon dioxide ($CO_2$) laser, or the like. A diameter of the opening portion 30a is 100 μm, for example.

In next step (see FIG. 2L), the contact vias 31 are formed by filling a copper in the opening portions 30a by the electroplating. In this case, as shown in FIG. 2L, top portions of the contact vias 31 are formed to rise slightly above the insulating resin layer 30 (e.g., about 30 μm). Then, a Ni—Au plating layer (not shown) of several μm thickness is formed on the top portions of the contact vias 31 by plating Ni (nickel) and Au (gold) sequentially by means of the electroplating.

A plurality of substrates 21 the unit of which is formed in this manner are prepared. Then, in next step (see FIG. 2M), two sheets of substrates 21 are arranged to oppose the semiconductor chip mounting surface to each other, and then bonded to put the insulating layer 11 between them. An anisotropic conductive film (ACF) is used as the insulating layer 11, and the units 10 formed on the substrate 21 are bonded by applying the pressure by means of the press machine. At that time, a portion of the anisotropic conductive film between the opposing contact vias 31 is pressurized strongly to show conductivity in the thickness direction (Z direction), and thus the contact vias 31 are connected electrically to each other. In the following, two units 10 bonded in this manner are called a pair unit.

Here, in the present embodiment, the anisotropic conductive film is employed as the insulating layer 11. But the insulating layer 11 may be formed by filling an insulating resin between the units 10, or the like, after the mutually opposing contact vias 31 of two units 10 are bonded by the solder, or the like.

In next step (see FIG. 2N), the substrate 21 is removed from the unit 10 by the etching. In the present embodiment, since the copper plate is employed as the substrate 21, an iron (III) chloride aqueous solution, a copper (II) chloride aqueous solution, or an ammonium peroxodisulfate aqueous solution, for example, is employed as an etchant. In this case, because end surfaces of the terminals 24 are covered with the solder layer 23, the etching of the terminals 24 can be prevented.

In next step (see FIG. 2O), a plurality of pair units are stacked to put the insulating layer 11 between them. In the present embodiment, the terminals 24 adjacent in the vertical direction are connected electrically to each other by employing the anisotropic conductive film as the insulating layer 11. But the insulating layer 11 may be formed by filling the insulating resin between the pair units, or the like, after the terminals 24 are bonded by the solder, or the like.

A stacked structural body 1a is formed by stacking a plurality of units 10 in this manner, and then this stacked structural body 1a is cut into the individual electronic parts packaging structure 1. Accordingly, the electronic parts packaging structure 1 shown in FIG. 1 in the present embodiment is completed.

According to the manufacturing method of the present embodiment, the solder resist layer 22, the insulating resin layer 30, etc. are supported by the substrate 21 until two units 10 are bonded to form the pair unit. Therefore, the handling is facilitated. Also, according to the present embodiment, the electronic parts packaging structure (semiconductor device) 1 is manufactured by removing the substrate 21 after the formation of the pair unit and then stacking a plurality of pair units. As a result, the thickness can be reduced rather than the electronic parts packaging structure having the supporting, substrate in the prior art, and thus a much higher mounting density can be attained.

In addition, in the electronic parts packaging structure 1 manufactured by the manufacturing method of the present embodiment, the arrangement of the solder resist layer 22, the semiconductor chip 27, the wirings 26, the terminals 24, the contact vias 31, etc. is vertically symmetrical between the units 10 adjacent in the vertical direction. Therefore, directions of the warp due to the difference in the coefficients of thermal expansion among the semiconductor chip 27, the insulating resin layer 30, the wirings (metal films) 26, and the like come opposite in the units 10 adjacent vertically. As a result, such a situation can be avoided that the warp is caused in the electronic parts packaging structure 1.

For example, a coefficient of thermal expansion of the copper constituting the wirings 26, the terminals 24, and the contact vias 31 is 16.2 ppm/° C., a coefficient of thermal expansion of the semiconductor chip 27 (silicon chip) is 3.4 ppm/° C., a coefficient of thermal expansion of the insulating resin layer 30 (epoxy resin) is 60 ppm/° C., a coefficient of thermal expansion of the underfill 29 (epoxy-based resin) is 33 ppm/° C., and a coefficient of thermal expansion of the solder resist layer 22 (epoxy-based resin) is 60 ppm/° C. According to the present embodiment, even in the electronic parts packaging structure (semiconductor device) constructed by the members having the different coefficient of thermal expansion respectively, a warp is reduced extremely small and yield of the product becomes high.

Figure 3:
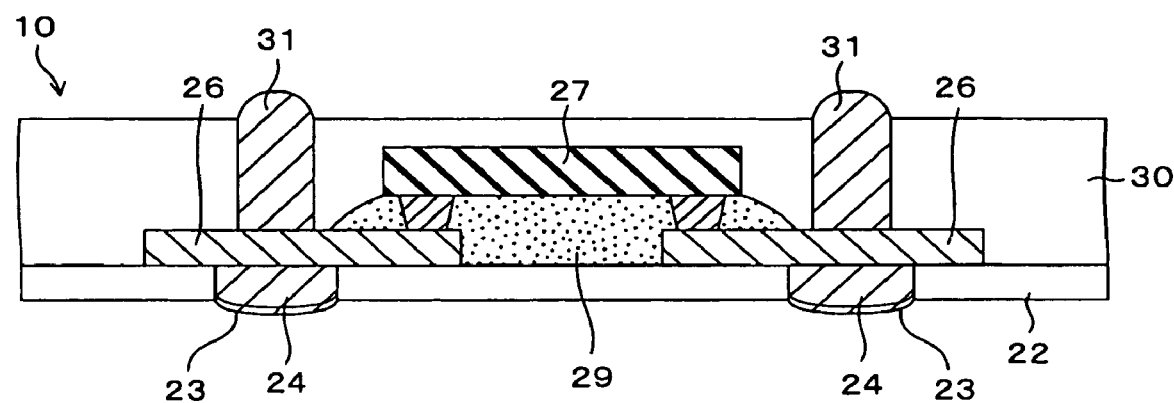
FIG. 3 is a sectional view showing a variation of the method of manufacturing the electronic parts packaging structure according to the first embodiment of the present invention.

In the above embodiment, the stacked structural body 1a is formed by bonding two sheets of units 10 to obtain the pair unit in the step shown in FIG. 2M, and then by removing the substrate 21 in the step shown in FIG. 2N, and then by stacking a plurality of pair units in the step shown in FIG. 2O. In this event, after the step shown in FIG. 2L, as shown in FIG. 3, the substrate may be removed from the unit 10 and then, as shown in FIG. 2O, the direction of a plurality of units 10 may be changed alternately and the units 10 may be stacked and bonded to put the insulating layer 11 between them.

Also, in the present embodiment, the case where the semiconductor chip 27 is mounted to direct its device forming surface toward the substrate 21 (so-called face down) is explained. But the invention can be applied to the case where the semiconductor chip 27 is mounted to direct its device forming surface toward the opposite side to the substrate 21 and is connected electrically to the wirings by the wire bonding (so-called face up).

Second Embodiment

Figure 4:
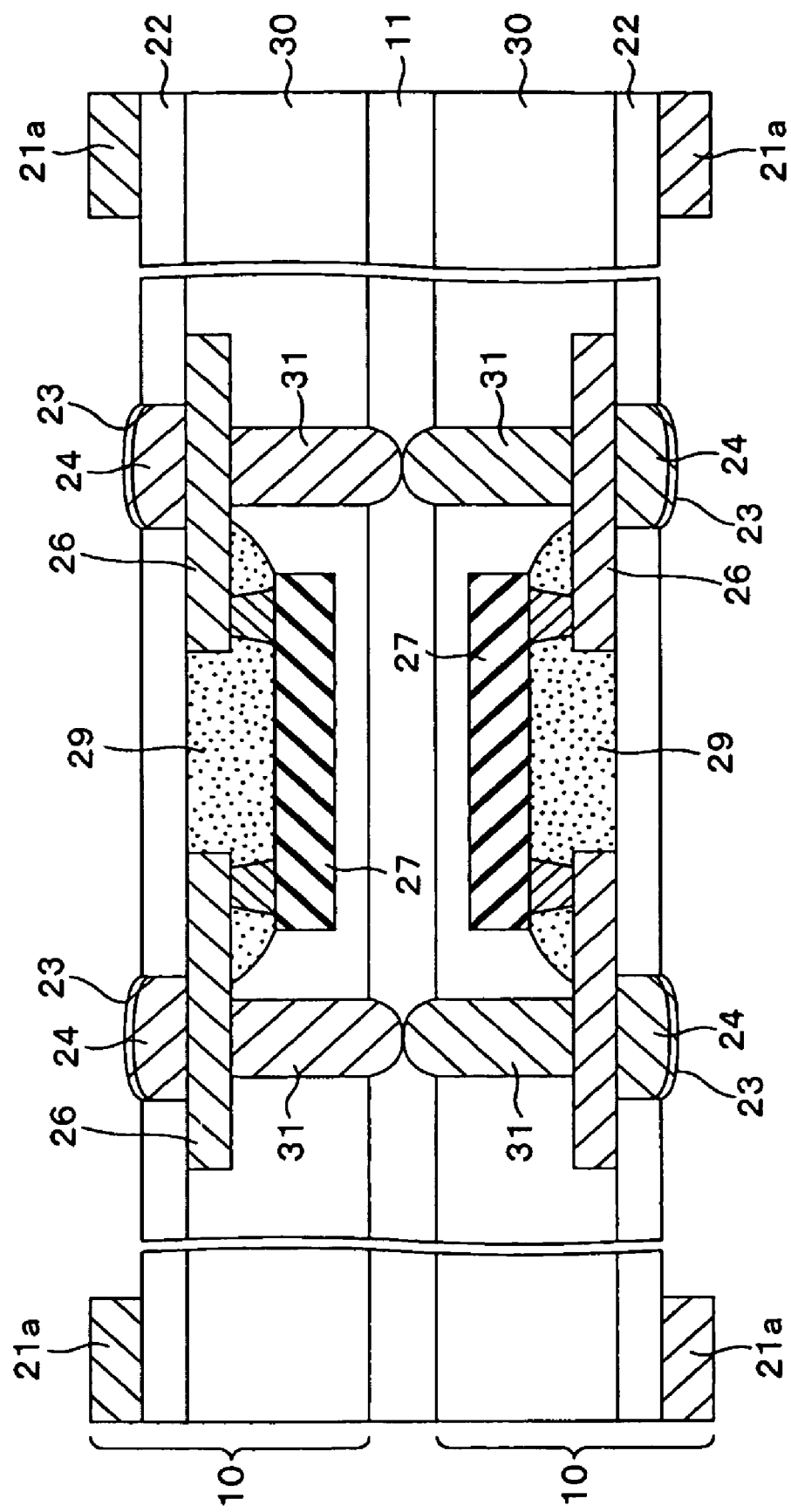
FIG. 4 is a sectional view showing a method of manufacturing an electronic parts packaging structure according to a second embodiment of the present invention.
Figure 5:
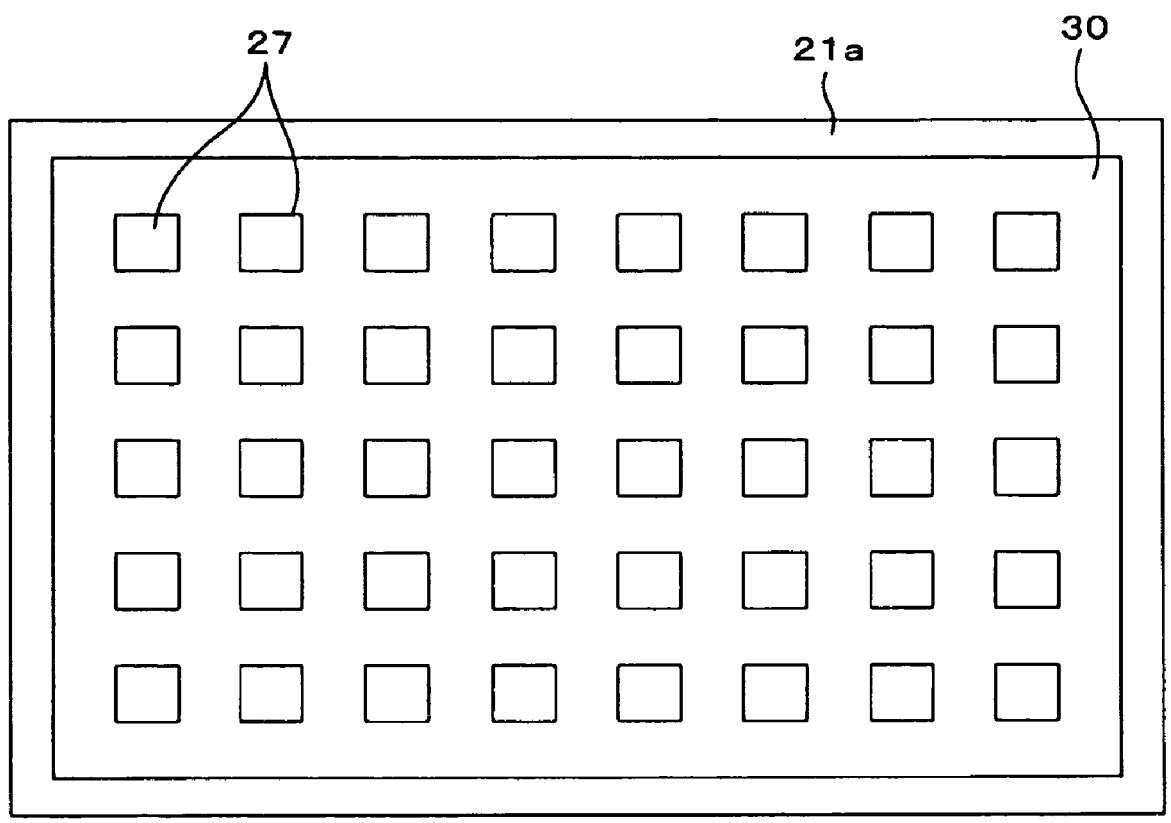
FIG. 5 is a schematic plan view (general view) showing the method of manufacturing the electronic parts packaging structure according to the second embodiment of the present invention.

FIG. 4 is a sectional view showing a method of manufacturing an electronic parts packaging structure according to a second embodiment of the present invention, and FIG. 5 is a schematic plan view (general view) showing the same. In FIG. 4, the same reference symbols are affixed to the same constituent parts in FIG. 2N.

A difference of the present embodiment from the first embodiment is that an edge portion is left like a frame when the substrate 21 is removed by the etching. Since other configurations are basically similar to the first embodiment, explanation of redundant portions will be omitted herein.

In the first embodiment, in step shown in FIG. 2N, the substrate 21 is removed completely from the unit 10. As described above, since a plurality of units 10 are formed at the same time while using a sheet of substrate 21 in the first embodiment, it may be considered that, depending on the number of the Wilts 10 formed simultaneously, the unit 10 lacks the rigidity to interfere with its handling after the substrate 21 is removed.

For this reason, in the second embodiment, as shown in FIG. 4 and FIG. 5, when the substrate is etched, a metal film (an edge portion of the substrate 21) 21a is left like a frame along an outer edge by the photolithography method.

Accordingly, such an advantage can be achieved that a deflection in handling can be suppressed and the handling can be made easy. In this case, the frame-like metal film 21a is cut off and removed when the substrate 21 is separated into individual units 10.

Third Embodiment

Figure 6A:
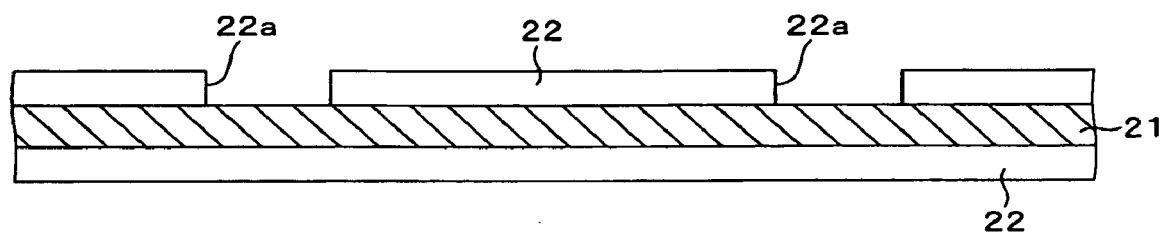
FIGS. 6A and 6B are sectional views showing a method of manufacturing an electronic parts packaging structure according to a third embodiment of the present invention.
Figure 6B:
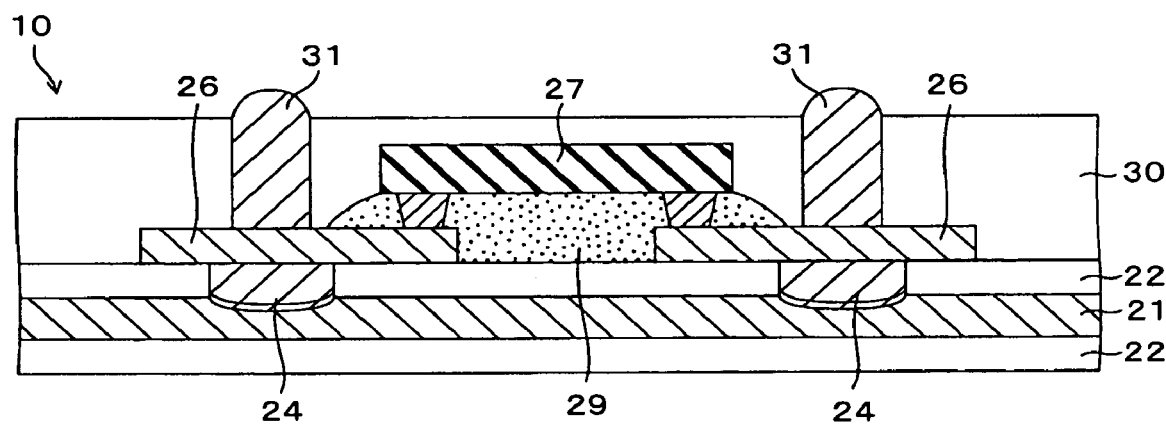

FIGS. 6A and 6B are sectional views showing a method of manufacturing an electronic parts packaging structure according to a third embodiment of the present invention.

A difference of the present embodiment from the first embodiment is that the solder resist layer 22 is also formed on the back surface (surface opposite to the semiconductor chip mounting surface) of the substrate 21. Since other configurations are basically similar to the first embodiment, explanation of redundant portions will be omitted herein.

In the present embodiment, as shown in FIG. 6A, the solder resist layer 22 is formed on both surfaces of the substrate 21. Then, like the first embodiment, as shown in FIG. 6B, the terminals 24 and the wirings 26 are formed and the semiconductor chip 27 is mounted on the wirings 26. Then, the underfill 29 is filled between the semiconductor chip 27 and the wirings 26 and the solder resist layer 22, then the insulating resin layer 30 for covering the semiconductor chip 27 is formed, and then the contact vias 31 are formed.

Then, as shown in FIG. 2M, two substrates 21 on which the unit 10 is formed respectively are arranged to oppose the semiconductor chip mounting surface to each other, and then bonded to put the insulating layer 11 between them. Then, the solder resist layer 22 formed on the back surface side is removed by the mechanical polishing or the plasma etching. Thus, the pair unit is formed in this manner. Then, as shown in FIG. 2N, the substrates 21 are removed by the etching. Then, as shown in FIG. 2O, a plurality of pair units are stacked and bonded to put the insulating layer 11 between them.

In the case where the solder resist layer 22 is formed on one surface of the substrate 21 made of copper like the first embodiment, when the post baking is applied at a temperature of 150 to 200° C., in some cases the substrate 21 is warped due to a difference in the coefficient of thermal expansion between the substrate 21 and the solder resist layer 22 to interfere with the handling. According to the experiment made by the inventors of this application, it has been confirmed that, when a wafer-shaped copper plate having a diameter of 150 mm and a thickness of 0.3 mm is used as the substrate 21 and then the solder resist layer 22 of 25 μm thickness is formed only on one-side surface of the substrate 21, a warp of about 6 mm occurs after the post baking. In contrast, like the present embodiment, in case the solder resist layer 22 is formed on both surfaces of the substrate 21, a warp seldom occurs. It is understood from this fact that preferably the solder resist layer 22 should also be formed on the back surface side of the substrate 21.

The material of the layer formed on the back surface side of the substrate 21 is not particularly limited if its coefficient of thermal expansion is close to that of the solder resist layer formed on the front surface side.

Fourth Embodiment

Figure 7:
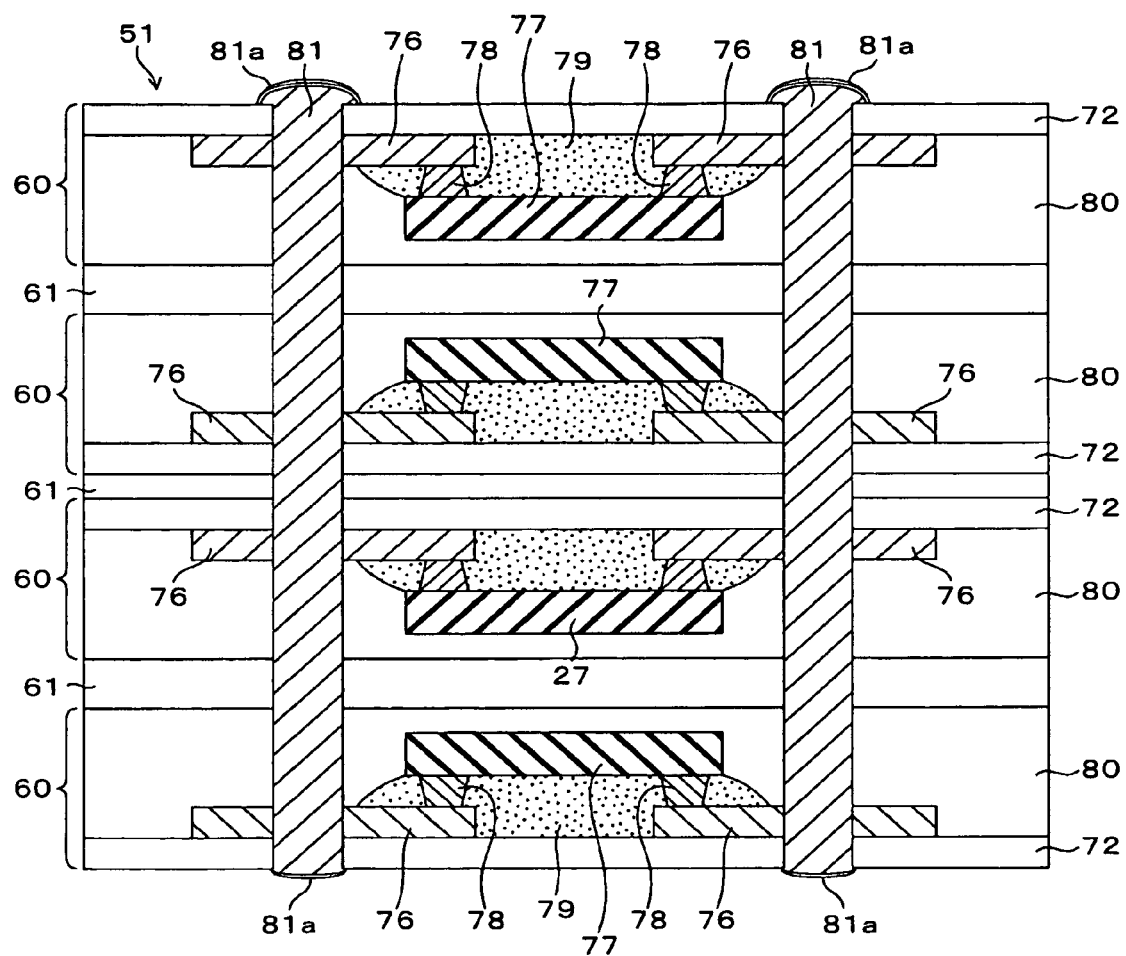
FIG. 7 is a sectional view showing an electronic parts packaging structure according to a fourth embodiment of the present invention.

FIG. 7 is a sectional view showing an electronic parts packaging structure according to a fourth embodiment of the present invention.

An electronic parts packaging structure (semiconductor device) 51 of the present embodiment has a structure that plural (four in FIG. 7) sheet (thin film)-like units 60 are stacked to put an insulating layer 61 between them. Each unit 60 is constructed by an insulating resin layer (second insulating layer) 80, a semiconductor chip (electronic parts) 77 buried in the insulating resin layer 80, a solder resist layer (first insulating layer) 72, and wirings 76. A thickness of one unit 60 is about 200 μm (about 100 to 300 μm), for example, and respective units 60 are electrically connected mutually via through electrodes 81 (connection portions) that pass through the electronic parts packaging structure 51 from one surface side to the other surface side. Both end portions of the through electrode 81 are covered with a Ni—Au plating layer 81a.

In the electronic parts packaging structure 51 of the present embodiment, like the first embodiment, the units 60 adjacent in the vertical direction are arranged in the opposite direction mutually. That is, arrangement of the solder resist layer 72, the semiconductor chip 77, the wirings 76, the insulating resin layer 80, etc. is symmetrical between two units 60 adjacent in the vertical direction.

As described above, one unit 60 is constructed by the semiconductor chip 77, the solder resist layer 72, the wirings 76, and the insulating resin layer 80. The solder resist layer 72 is bonded to one surface of the insulating resin layer 80. The wirings 76 are formed on the surface of the solder resist layer 72 of the insulating resin layer 80 side, and are connected electrically to the connection terminals of the semiconductor chip 77 via bumps 78. An underfill (protection film) 79 for protecting the device forming surface of the semiconductor chip 77 is filled between the semiconductor chip 77 and the solder resist layer 72.

As described above, in the electronic parts packaging structure 51 of the present embodiment, each unit 60 is constructed by the solder resist layer 72, the semiconductor chip 77, the insulating resin layer 80, etc., and does not have a high strength supporting substrate (in other words, a thick substrate) serving as a core. Also, a general strength of the packaging structure can be ensured by stacking a plurality of units 60. As a result, the electronic parts packaging structure 51 of the present embodiment achieves such an effect that a mounting density can be increased much higher than the prior art, like the first embodiment.

Also, in the electronic parts packaging structure 51 of the present embodiment, the solder resist layer 72, the semiconductor chip 77, the wirings 76, the insulating resin layer 80, etc. are arranged symmetrically between the units 60 adjacent in the vertical direction. Therefore, even though a thermal stress is generated due to a difference in the coefficients of thermal expansion among the semiconductor chip 77 and the insulating resin layer 80 and the wirings (the metal films) 76, the warping directions by the thermal stress become opposite in the units 60 adjacent in the vertical direction. As a result, the thermal stresses can be canceled each other and thus it can be prevented that the warp is generated in the electronic parts packaging structure 51.

In addition, the electronic parts packaging structure 51 of the present embodiment possesses such an advantage that, because an outermost peripheral surface is covered with the solder resist layer 72 made of an acrylic-based resin or an epoxy-based resin whose strength is higher than an epoxy resin or the like, this packaging structure is hard to break down like the first embodiment.

Further, the present embodiment possesses such an advantage that, since respective units 60 are connected commonly by the through electrodes 81, the reliability of the electrical connection between respective units 60 becomes higher than the first embodiment.

Figure 8A:
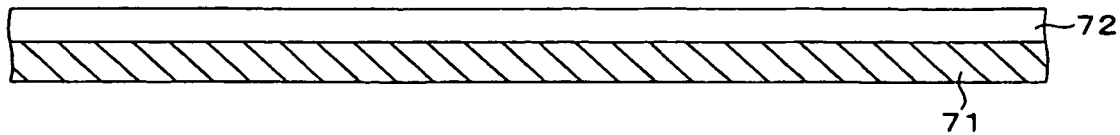
FIGS. 8A and 8N are sectional views showing a method of manufacturing the electronic parts packaging structure according to the fourth embodiment of the present invention.
Figure 8B:
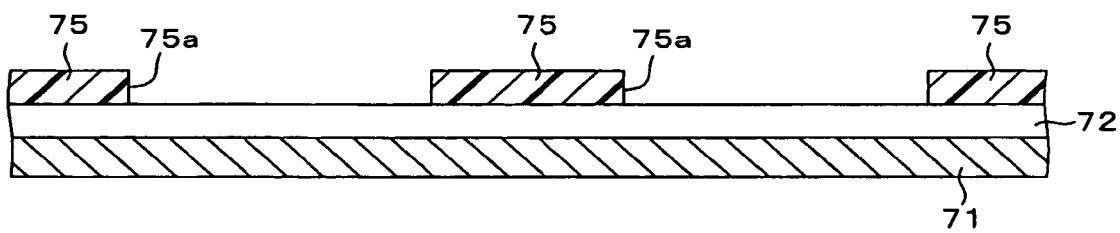
Figure 8C:
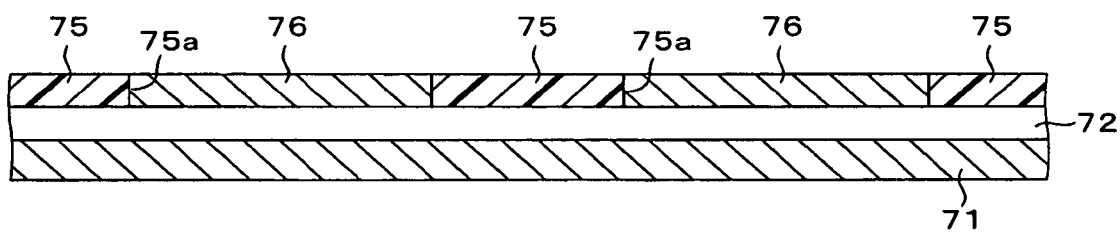
Figure 8D:
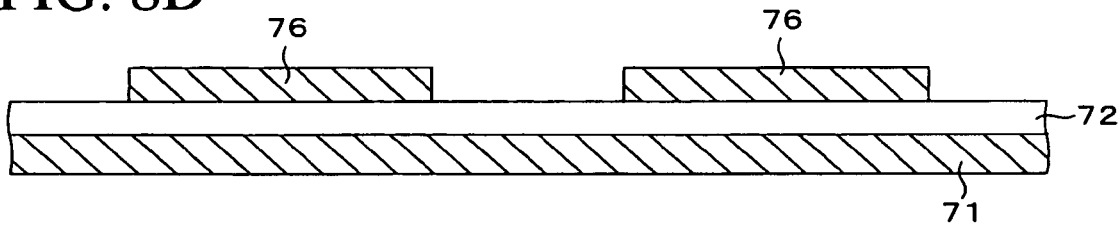
Figure 8E:
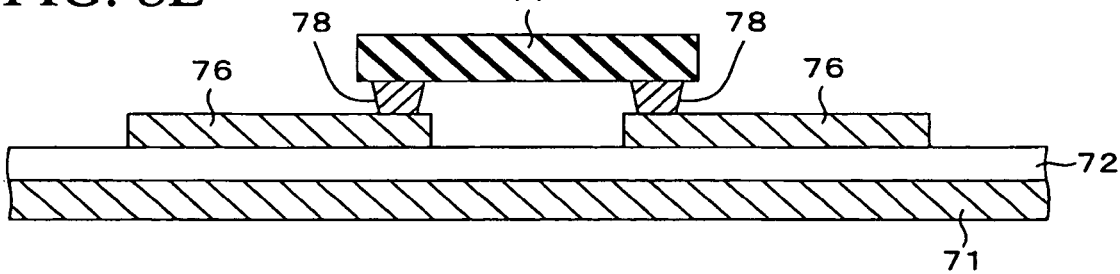
Figure 8F:
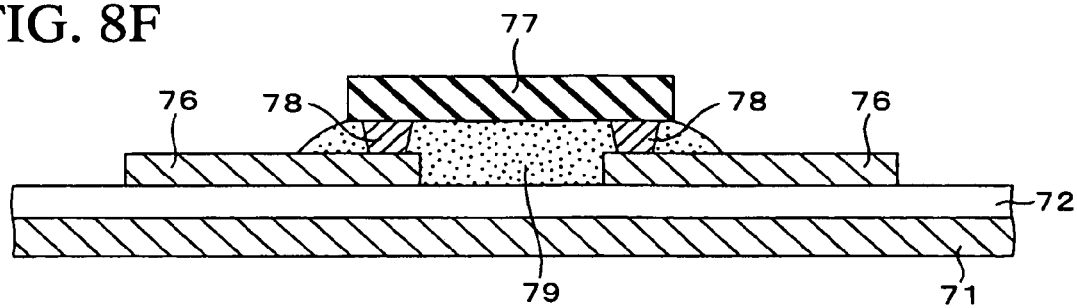
Figure 8G:
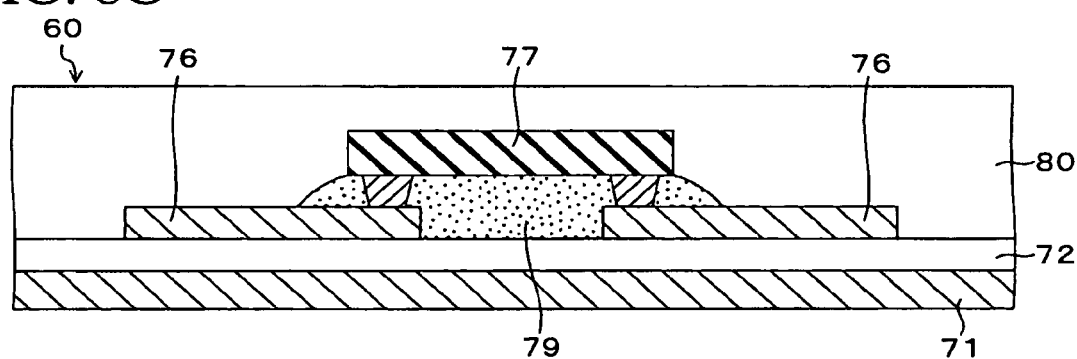
Figure 8H:
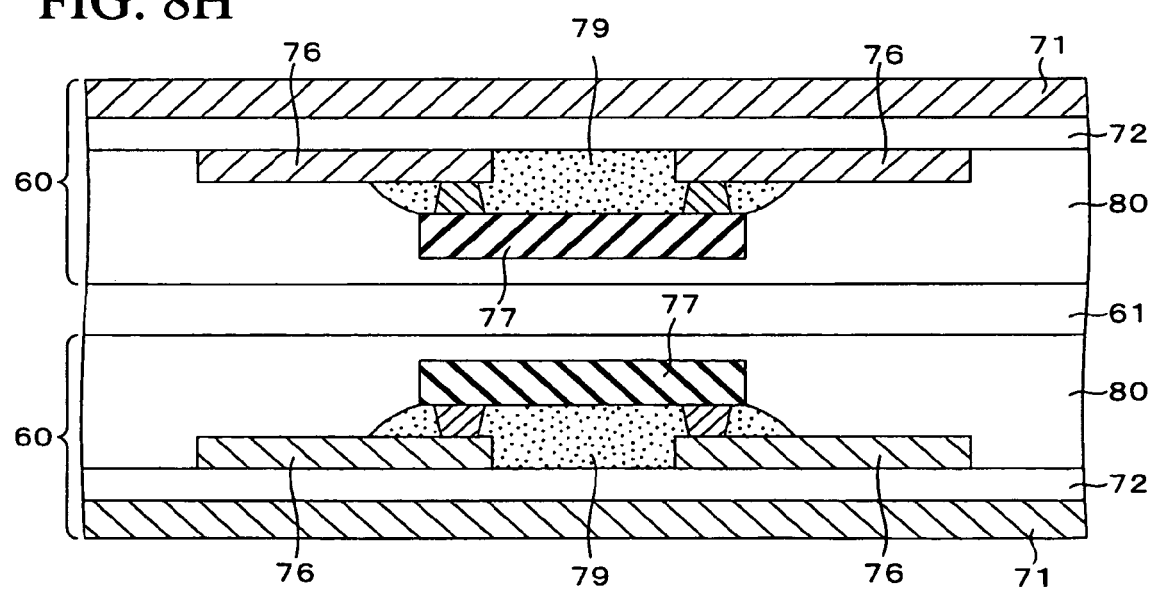
Figure 8I:
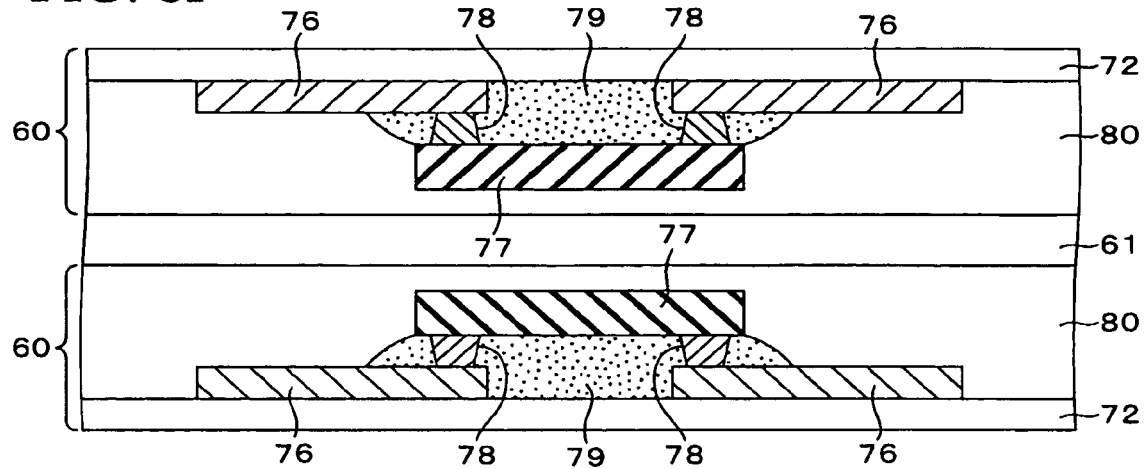
Figure 8J:
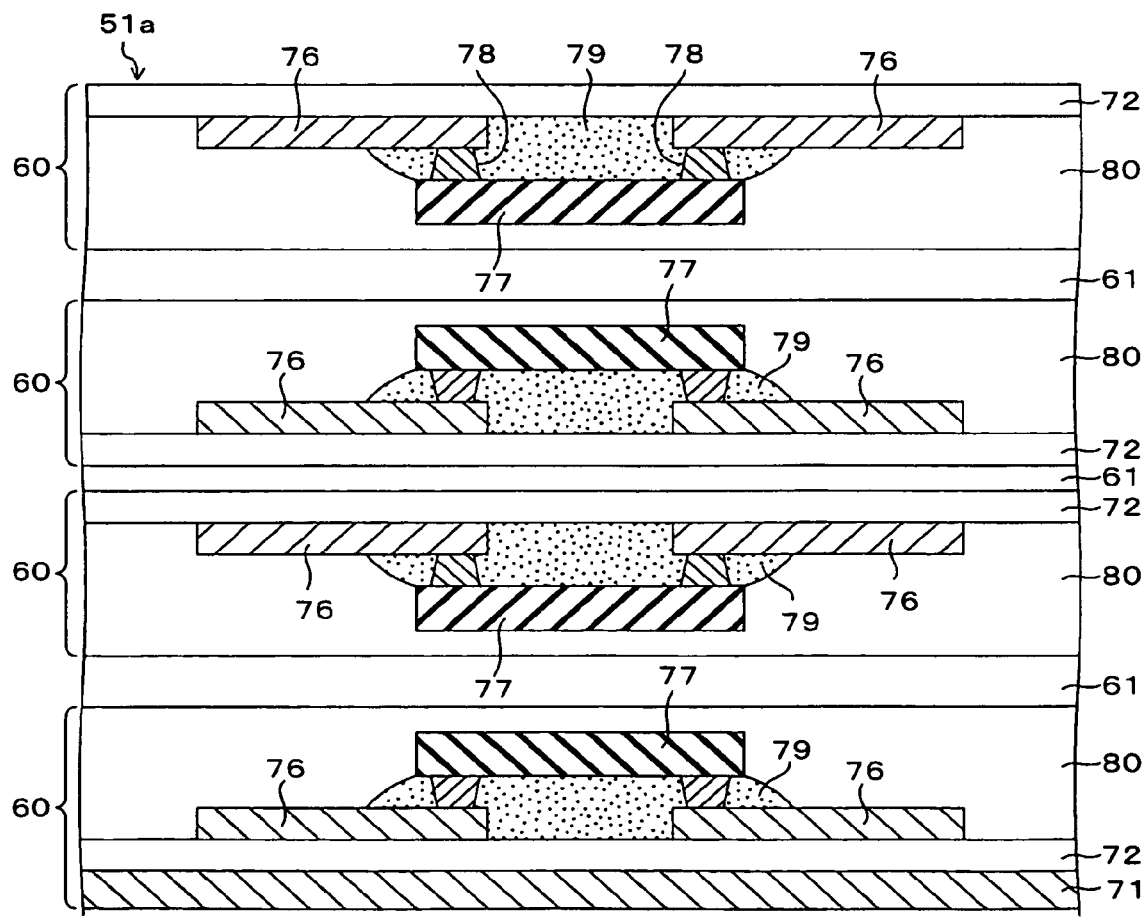
Figure 8K:
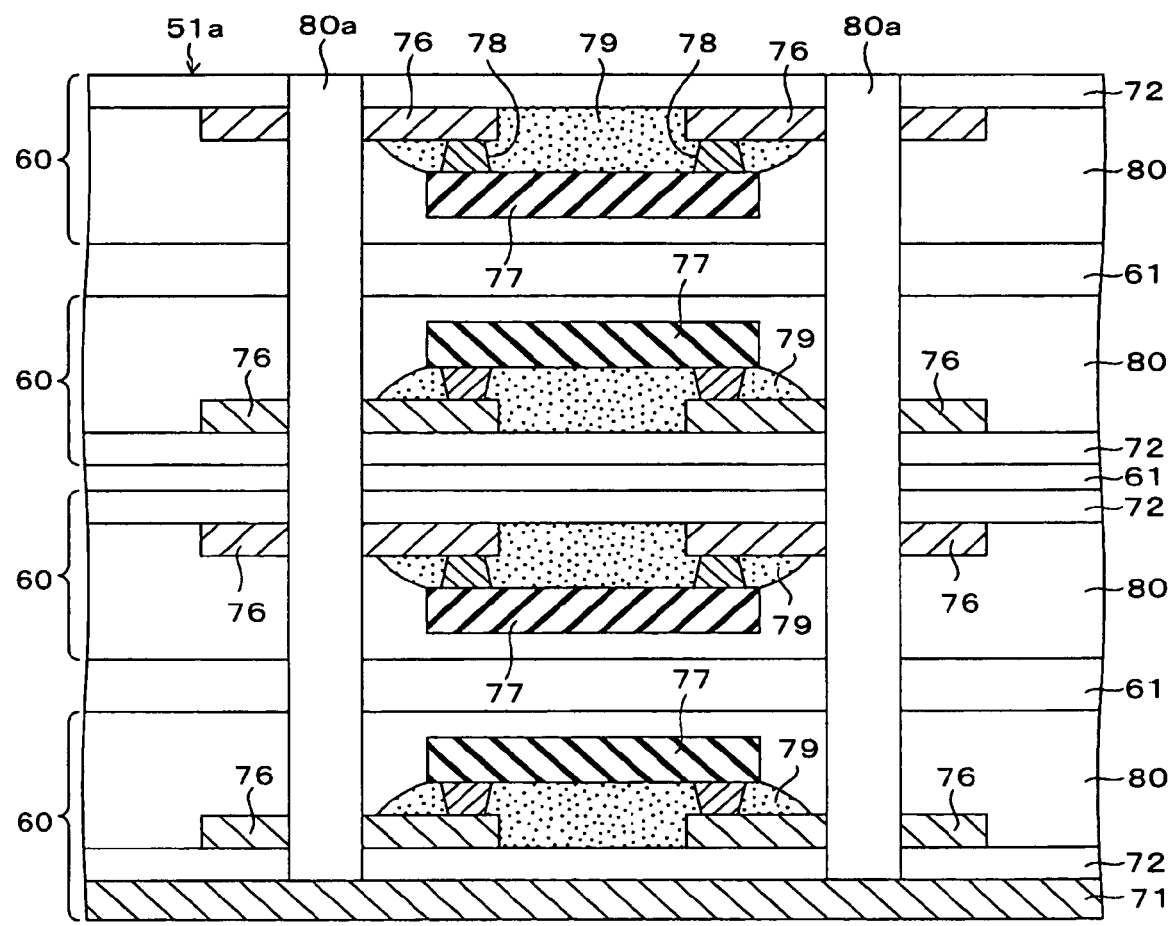
Figure 8L:
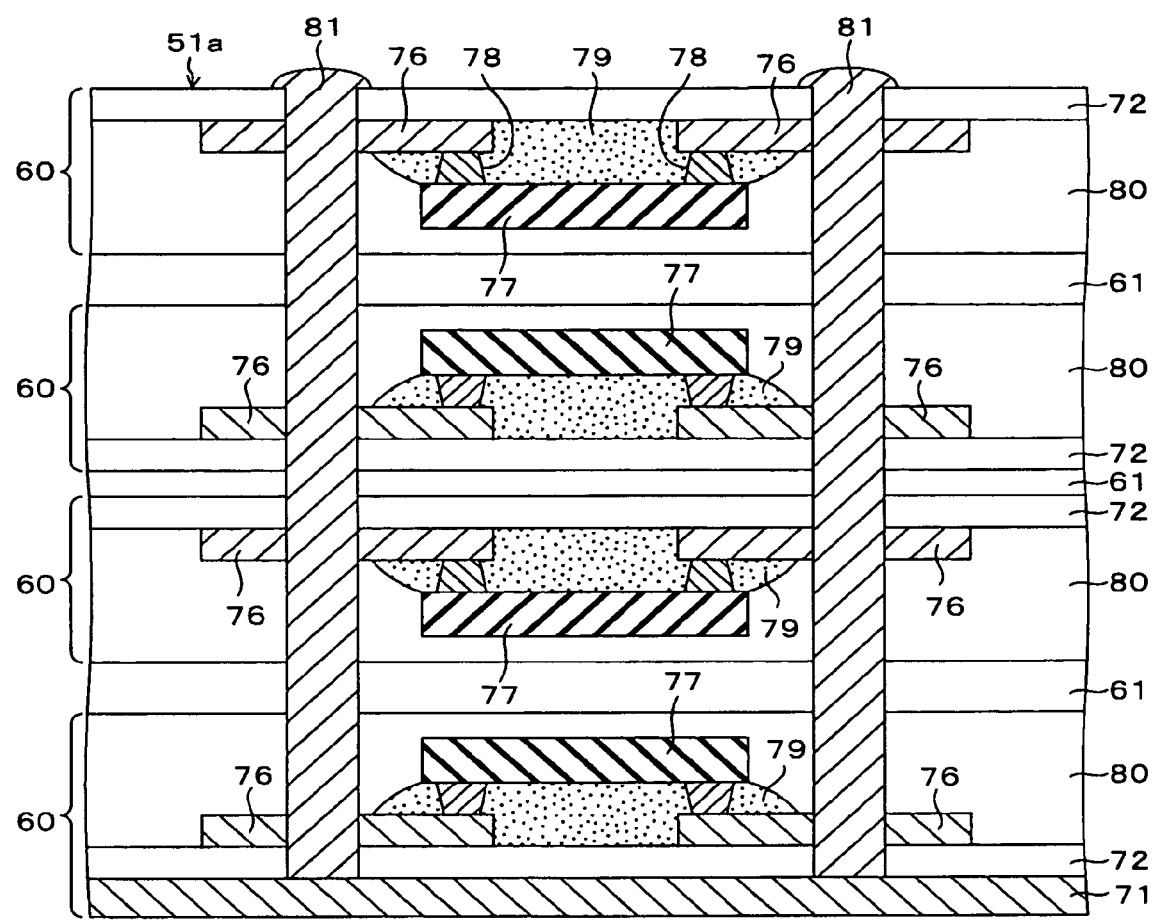
Figure 8M:
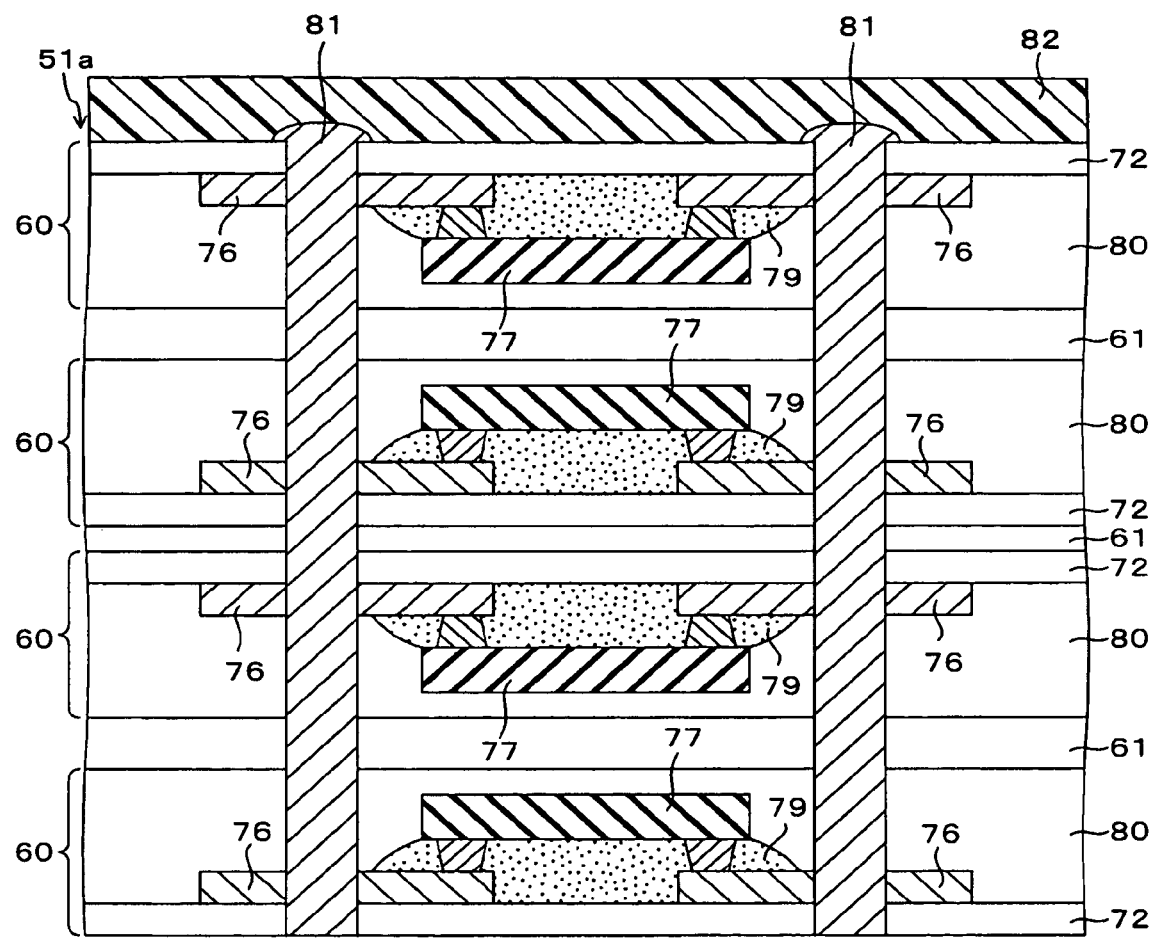
Figure 8N:
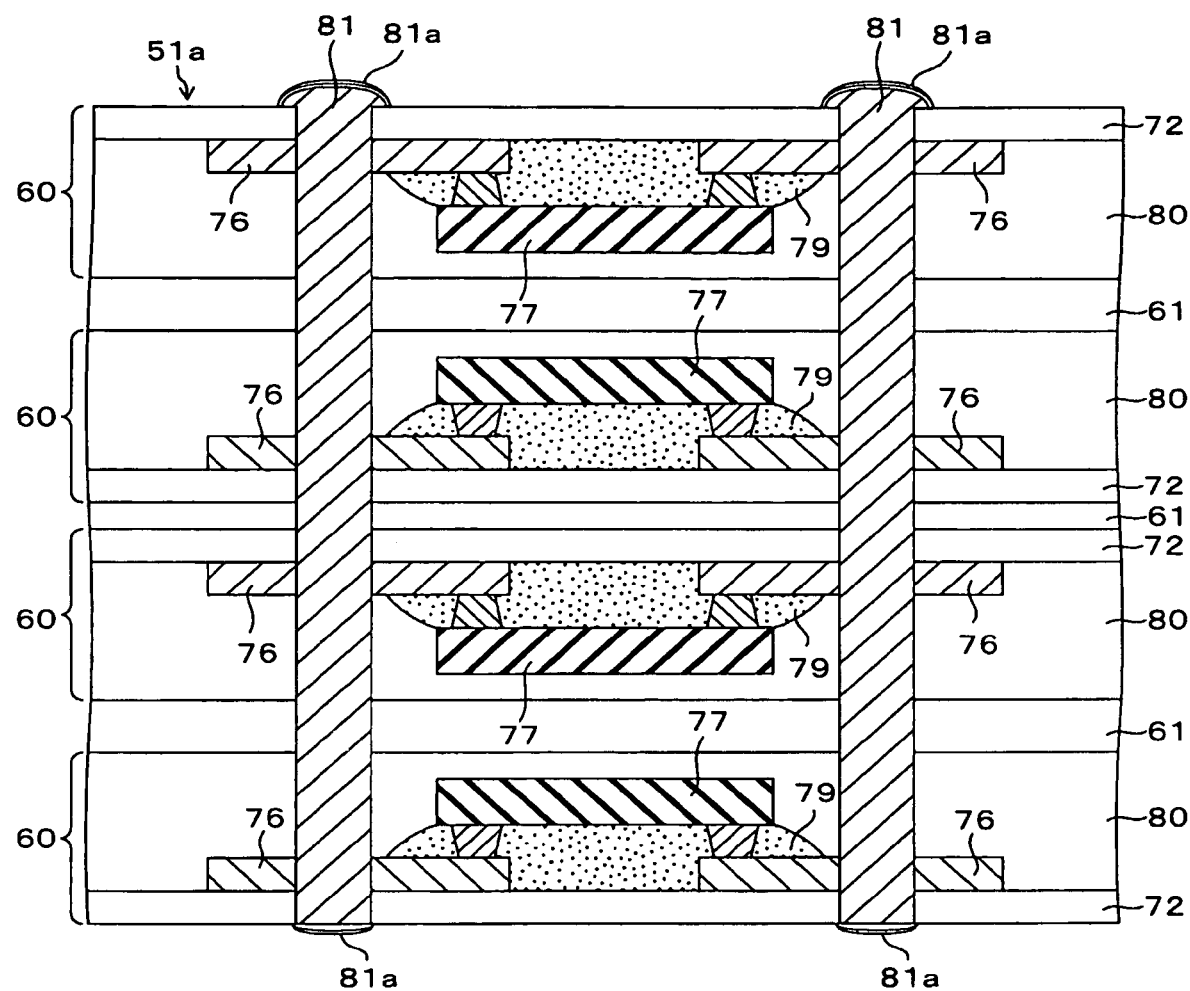

FIGS. 8A and 8N are sectional views showing a method of manufacturing the electronic parts packaging structure according to the fourth embodiment of the present invention in order of steps. In this case, in FIGS. 8A to 8N, only one unit forming area is shown to simplify the explanation, but actually a plurality of units 60 are formed simultaneously on a sheet of substrate 71.

First, in first step (see FIG. 8A), a substrate 71 made of copper (Cu) and having a size of 300 mm×500 mm and a thickness of 0.1 mm, for example, is prepared. Then, a photosensitive solder resist is coated on one surface of the substrate 71 by the screen printing method, and thus the solder resist layer 72 of 20 to 30 μm thickness, for example, is formed. Then, a surface of the solder resist layer 72 is made rough by applying the plasma process (dry etching). Then, a seed layer (not shown) is formed on the solder resist layer 72 by plating a copper by means of the electroless plating. The plasma process is not indispensable, but preferably this plasma process should be applied to ensure sufficiently adhesiveness of the dry film or the plating layer used in the later step.

In next step (see FIG. 8B), a dry film (photosensitive resist film) 75 is pasted on an upper side (on the seedlayer) of the substrate 71. Then, the dry film 75 is exposed by using a predetermined exposure mask (not shown), and then opening portions 75a are formed in the dry film 75 by applying the developing process. These opening portions 75a are used to form the wirings 76 in next step.

In next step (see FIG. 8C), the copper is buried in the opening portion 75a in the dry film 75 by the electroplating of copper, and thus the wirings 76 are formed. Then, in next step (see FIG. 8D), the dry film 75 is removed by a removing liquid. Then, respective wirings 76 are separated electrically by removing the exposed seed layer by means of the etching.

In next step (see FIG. 8E), the semiconductor chip 77 is flip-chip bonded to the wirings 76. A thickness of this semiconductor chip 77 is reduced thinner than 150 μm (preferably almost 50 μm), for example, and the connection electrodes are provided to edge portions of the device forming surface (lower side in FIG. 8E). Then, the bumps (e.g., Au stud bumps) 78 are formed on the connection electrodes (lower side in FIG. 8E), and the semiconductor chip 77 is connected electrically to the wirings 76 via the bumps 78.

In next step (see FIG. 8F), the underfill 79 is filled between the semiconductor chip 77 and the substrate 71 (the solder resist layer 72 and the wirings 76). As the underfill 79, an epoxy resin, for example, can be employed. It is preferable that a coefficient of thermal expansion of the underfill 79 should be adjusted to the midway of a coefficient of thermal expansion of the semiconductor chip 77 and a coefficient of thermal expansion of the solder resist layer 72 by mixing the filler such as silica, for example, with the underfill 79.

In next step (see FIG. 8G), the insulating resin layer 80 is formed by pasting a film-like epoxy resin on the substrate 71 to cover the semiconductor chip 77. Then, the epoxy resin constituting the insulating resin layer 80 is cured. Instead of the pasting of the film-like epoxy resin, the insulating resin layer 80 may be formed by coating the epoxy resin. Also, a polyimide resin or other insulating resin may be employed in place of the epoxy resin. A plurality of substrates 71 on which the unit 60 is formed in this manner respectively are prepared.

Then, in next step (see FIG. 8H), two units 60 are arranged to oppose the semiconductor chip mounting surface to each other, and then bonded together to put the insulating layer 61 between them. In the first embodiment, the anisotropic conductive film (the insulating layer 11 in FIG. 2M) is used to bond two units 10. In the present embodiment, a common adhesive resin film such as an epoxy resin, or the like is used as the insulating layer 61 that is used to bond two units 60. In the following, two units 60 bonded in this manner are called the pair unit.

In next step (see FIG. 8I), the substrate 71 is removed by the etching using an iron (III) chloride aqueous solution, a copper (II) chloride aqueous solution, or an ammonium peroxodisulfate aqueous solution, for example. In this case, the substrate 71 on one surface side of one of the pair units, which are stacked in later step, is covered with the resist film such that one substrate 71 is left after the etching.

In next step (see FIG. 8J), plural pair units are stacked to put the insulating layer 61, which is formed of a common adhesive resin film, between them and then bonded together. In this case, the unit 60 on which the substrate 71 is left is set to the lowermost side.

In this manner, a stacked structural body 51a constructed by stacking a plurality of units 60 and having the substrate 71 on the lowermost side only is formed. Then, in next step (see FIG. 8K), through holes 80a reaching the substrate 71 from an upper surface of the stacked structural body 51a are formed by the YAG laser. In the present embodiment, since the copper is filled in the through holes 80a by the electroplating as described later, laser irradiation conditions (laser power, irradiation time, etc.) are set in such a way that the through holes 80a reach the substrate 71 but no hole is opened in the substrate 71. At this time, since the optimum laser irradiation conditions are changed depending upon material/thickness of the resin layer 80, thickness of the wirings 76, stacked layer number of the units 60, etc., such optimum laser irradiation conditions must be derived in advance by the experiment, or the like. In this case, the through holes 80a may be formed by the drilling in place of the laser irradiation.

In next step (see FIG. 8L), the copper is filled in the through holes 80a by depositing the copper on the substrate 71 by means of the electroplating, and thus the through electrodes 81 are formed. At this time, as shown in FIG. 8L, the copper is plated until top ends of the through electrodes 81 are slightly projected from the uppermost solder resist layer 72.

In next step (see FIG. 8M), an etching resist film 82 is formed on the solder resist layer 72 on the upper side (the side to which the through electrodes 81 are projected) of the stacked structural body 51a to protect projection portions of the through electrodes 81. Then, the substrate 71 on the lower side of the stacked structural body 51a is removed by the etching. Then the etching resist film 82 is removed.

In next step (see FIG. 8N), Ni and Au are sequentially plated on the exposed portions of the through electrodes 81, i.e., the upper side and the lower side of the through electrodes 81 by the electroless plating. Thus, the Ni—Au plating layer 81a having a thickness of several μm are formed.

Then, the stacked structural body 51a is cut into individual electronic parts packaging structures 51. Accordingly, the electronic parts packaging structure 51 of the present embodiment shown in FIG. 7 is completed.

In the above first embodiment, as shown in FIGS. 2M to 2O, the units 10 are connected electrically by using the anisotropic conductive film (the insulating layer 11). In this case, when the contact vias 31 or the terminals to put the anisotropic conductive film between them are displaced, it is impossible to get an enough conductive performance. In contrast, in the present embodiment, the through holes 80a are formed after the stacked structural body 51a is formed by stacking respective units 60, and then the through electrodes 81 are formed by filling the copper in the through holes 80a. Then, the electrical connection between respective units 60 can be obtained by the through electrodes 81. Therefore, the present embodiment possesses such an advantage that the electrical connection between respective units 60 can be made easier than the first embodiment and also the electronic parts packaging structure with high reliability can be manufactured.

In the above fourth embodiment, when the through holes 80a are formed, these holes do not pass through the substrate 71. But the through holes 80a may be formed to pass through the substrate 71. In such case, respective units 60 may be connected electrically by applying the copper electroless plating and the copper electroplating sequentially to inner wall surfaces of the through holes 80a, for example.

Also, in the present invention, as explained in the second embodiment, when the substrate 71 is removed by the etching, its frame portion may be left like a frame. In addition, as explained in the third embodiment, the solder resist layer may also be formed on the back surface side (lower surface side) of the substrate 71 and then such solder resist layer may be removed from the back surface side before removing the substrate 71.

What is claimed is:

1. A method of manufacturing an electronic parts packaging structure, comprising the steps of:

preparing a plurality of sheet-like units each of which is constructed by a first insulating layer, a wiring formed on one surface of the first insulating layer, electronic parts connected to the wiring, a second insulating layer formed on an one surface side of the first insulating layer to cover the electronic parts, and a connecting portion for connecting electrically the wiring, and stacking mutually the units to arrange directions of unit adjacent in a thickness direction alternately oppositely, and bonding the units such that electronic parts of respective units are electrically connected mutually via connecting portions, wherein the step of preparing the unit includes
a first step of forming the first insulating layer made of an insulating resin on a substrate,
a second step of forming an opening by patterning the first insulating layer,
a third step of forming a recess by etching the substrate exposed from the opening,
a fourth step of forming a terminal by filling a metal in the opening,
a fifth step of forming a wiring, which is connected to the terminal, on the first insulating layer,
a sixth step of bonding the electronic parts onto the wiring,
a seventh step of forming the second insulating layer, which covers the electronic parts, on the first insulating layer,
an eighth step of forming a hole that reaches the wiring from an upper surface of the second insulating layer,
a ninth step of forming a contact via by filling a metal in the hole, and
a tenth step of removing the substrate,
wherein the connection portions have the terminal and the contact via.

2. The method of manufacturing an electronic parts packaging structure, according to claim 1, wherein, after the ninth step, two units are bonded to oppose a surface on which the electronic parts is mounted to each other, and then the substrate is removed by executing the tenth step.

3. The method of manufacturing an electronic parts packaging structure, according to claim 1, wherein, in the tenth step, an edge portion of the substrate is left like a frame and then the frame-like portion is cut off and removed after respective units are bonded.

4. The method of manufacturing an electronic parts packaging structure, according to claim 1, wherein, in the first step, a third insulating layer is formed on a lower surface of the substrate, and the third insulating layer is removed during a time from an end of the ninth step to a start of the tenth step.

5. A method of manufacturing an electronic parts packaging structure, comprising the steps of:

a) preparing a plurality of sheet-like units each of which is constructed by a first insulating layer, a wiring formed on one surface of the first insulating layer, electronic parts connected to the wiring, a second insulating layer formed on an one surface side of the first insulating layer to cover the electronic parts, and a connecting portion for operatively connecting the wiring, wherein the step of preparing the unit includes:

i) forming the first insulating layer made of an insulating resin on a substrate;

ii) forming an opening by patterning the first insulating layer;

iii) forming a recess by etching the substrate exposed from the opening;

iv) forming a terminal by filling a metal in the opening;

v) forming a wiring, which is connected to the terminal, on the first insulating layer;

vi) bonding the electronic parts onto the wiring;

vii) covering the electronic parts with the second insulating layer on the first insulating layer;

viii) forming a hole that reaches the wiring from an upper surface of the second insulating layer;

ix) forming a contact via by filling a metal in the hole; and x) removing the substrate, wherein the connection portions have the terminal and the contact via;

b) adjacently stacking the plurality of units in a thickness direction such that the units are symmetrical in the thickness direction; and c) bonding the units such that electronic parts of respective units are electrically connected mutually via the connecting portions.

* * * * *